(12) United States Patent
Miura

(10) Patent No.: US 11,274,372 B2
(45) Date of Patent: Mar. 15, 2022

(54) FILM DEPOSITION APPARATUS

(71) Applicant: Tokyo Electron Limited, Tokyo (JP)

(72) Inventor: Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 660 days.

(21) Appl. No.: 15/591,300

(22) Filed: May 10, 2017

(65) Prior Publication Data

US 2017/0335453 A1    Nov. 23, 2017

(30) Foreign Application Priority Data

May 23, 2016 (JP) .............................. JP2016-102231

(51) Int. Cl.
*C23C 16/458* (2006.01)
*H01L 21/687* (2006.01)
(Continued)

(52) U.S. Cl.
CPC .......... *C23C 16/4584* (2013.01); *C23C 16/24* (2013.01); *C23C 16/402* (2013.01);
(Continued)

(58) Field of Classification Search
CPC . C23C 16/24; C23C 16/4405; C23C 16/4409; C23C 16/4412; C23C 16/45508; C23C 16/45519; C23C 16/45523; C23C 16/45525; C23C 16/45544; C23C 16/45548; C23C 16/45551; C23C 16/45557; C23C 16/45561; C23C 16/45563; C23C 16/45565;
(Continued)

(56) References Cited

U.S. PATENT DOCUMENTS 5,422,139 A * 6/1995 Fischer ................. C23C 16/455
  118/715
6,080,446 A * 6/2000 Tobe ....................... C23C 16/34
  257/E21.168
(Continued)

FOREIGN PATENT DOCUMENTS

JP   2011-135003    7/2011
JP   2013-135154    7/2013
(Continued)

*Primary Examiner* — Jeffrie R Lund
*Assistant Examiner* — Stanislav Antolin
(74) *Attorney, Agent, or Firm* — IPUSA, PLLC

(57) ABSTRACT

A film deposition apparatus includes a process chamber, a rotary table, a first reaction gas supply part disposed in a first process region and configured to supply a first reaction gas, a second reaction gas supply part disposed in a second process region apart from the first reaction gas supply part in a circumferential direction of the rotary table and configured to supply a second reaction gas, and separation gas supply parts disposed in a separation region between the first reaction gas supply part and the second reaction gas supply part and configured to supply a separation gas for separating the first reaction gas and the second reaction gas. The separation gas supply parts are configured to supply, in addition to the separation gas, an additive gas for controlling adsorption of the first reaction gas or for etching a part of material components included in the first reaction gas.

17 Claims, 14 Drawing Sheets

(51) Int. Cl.

| | |
|---|---|
| *C23C 16/505* | (2006.01) |
| *H01L 21/683* | (2006.01) |
| *H01J 37/32* | (2006.01) |
| *H01L 21/02* | (2006.01) |
| *C23C 16/40* | (2006.01) |
| *C23C 16/455* | (2006.01) |
| *C23C 16/56* | (2006.01) |
| *C23C 16/24* | (2006.01) |
| *C23C 16/50* | (2006.01) |
| *C23C 16/52* | (2006.01) |

(52) U.S. Cl.
CPC .. *C23C 16/45519* (2013.01); *C23C 16/45544* (2013.01); *C23C 16/45548* (2013.01); *C23C 16/50* (2013.01); *C23C 16/505* (2013.01); *C23C 16/52* (2013.01); *C23C 16/56* (2013.01); *H01J 37/3244* (2013.01); *H01L 21/02274* (2013.01); *H01L 21/683* (2013.01); *H01L 21/68764* (2013.01)

(58) Field of Classification Search
CPC ........ C23C 16/45574; C23C 16/45578; C23C 16/45587; C23C 16/45589; C23C 16/45591; C23C 16/458; C23C 16/4584; C23C 16/4585; C23C 16/4586; C23C 16/50; C23C 16/52; C23C 16/54; C30B 25/14; C30B 25/165; H01J 2237/332; H01J 37/3244; H01J 37/32449; H01J 37/32715; H01J 37/32733; H01J 37/32779; H01L 21/02104; H01L 21/02263; H01L 21/0228; H01L 21/28556; H01L 21/67126; H01L 21/67161; H01L 21/6719; H01L 21/67207; H01L 21/68764; H01L 21/68771; H01L 21/68785
See application file for complete search history.

(56) References Cited

U.S. PATENT DOCUMENTS

| | | | | |
|---|---|---|---|---|
| 10,844,489 | B2* | 11/2020 | Iwasaki | H01J 37/3244 |
| 2002/0098627 | A1 | 7/2002 | Pomarede et al. | |
| 2003/0203626 | A1* | 10/2003 | Derderian | C23C 16/45565 |
| | | | | 438/689 |
| 2004/0099213 | A1* | 5/2004 | Adomaitis | C23C 16/52 |
| | | | | 118/715 |
| 2005/0059246 | A1* | 3/2005 | Yamada | C23C 16/45565 |
| | | | | 438/689 |
| 2006/0042754 | A1* | 3/2006 | Yoshida | H01J 37/32091 |
| | | | | 156/345.1 |
| 2008/0096369 | A1* | 4/2008 | Strzyzewski | C23C 16/45551 |
| | | | | 438/478 |
| 2008/0173238 | A1* | 7/2008 | Nakashima | C23C 16/345 |
| | | | | 118/723 R |
| 2008/0178805 | A1* | 7/2008 | Paterson | H01J 37/32091 |
| | | | | 118/723 I |
| 2008/0193673 | A1* | 8/2008 | Paterson | H01J 37/32091 |
| | | | | 427/569 |
| 2009/0017190 | A1* | 1/2009 | Sferlazzo | C23C 16/45589 |
| | | | | 427/10 |
| 2009/0061083 | A1* | 3/2009 | Chiang | C23C 16/45544 |
| | | | | 427/248.1 |
| 2009/0061644 | A1* | 3/2009 | Chiang | C23C 16/45544 |
| | | | | 438/763 |
| 2009/0324826 | A1* | 12/2009 | Kato | C23C 16/402 |
| | | | | 427/255.28 |
| 2010/0003405 | A1* | 1/2010 | Kappeler | C23C 16/45551 |
| | | | | 427/255.28 |
| 2010/0029065 | A1* | 2/2010 | Nagashima | C23C 16/303 |
| | | | | 438/478 |
| 2010/0055297 | A1* | 3/2010 | Kato | C23C 16/4584 |
| | | | | 427/8 |
| 2010/0055314 | A1* | 3/2010 | Kato | C23C 16/45551 |
| | | | | 427/255.28 |
| 2010/0055316 | A1* | 3/2010 | Honma | C23C 16/45551 |
| | | | | 427/255.28 |
| 2010/0055320 | A1* | 3/2010 | Honma | C23C 16/45544 |
| | | | | 427/255.28 |
| 2010/0155951 | A1* | 6/2010 | Koike | H01L 21/2855 |
| | | | | 257/751 |
| 2010/0216314 | A1* | 8/2010 | Honda | H01L 21/0212 |
| | | | | 438/737 |
| 2010/0229797 | A1* | 9/2010 | Kato | H01L 21/68764 |
| | | | | 118/730 |
| 2010/0272895 | A1* | 10/2010 | Tsuda | C23C 16/409 |
| | | | | 427/255.32 |
| 2011/0097494 | A1* | 4/2011 | Kerr | C23C 16/458 |
| | | | | 427/255.5 |
| 2011/0100489 | A1* | 5/2011 | Orito | C23C 16/45502 |
| | | | | 137/560 |
| 2011/0151122 | A1* | 6/2011 | Kato | C23C 16/402 |
| | | | | 427/255.23 |
| 2011/0155057 | A1* | 6/2011 | Kato | C23C 16/45519 |
| | | | | 118/719 |
| 2011/0159187 | A1* | 6/2011 | Kato | C23C 16/45544 |
| | | | | 427/255.26 |
| 2012/0088030 | A1* | 4/2012 | Kato | C23C 16/45551 |
| | | | | 427/255.5 |
| 2012/0132367 | A1* | 5/2012 | Tezuka | H01J 37/3244 |
| | | | | 156/345.33 |
| 2012/0152172 | A1* | 6/2012 | Hwang | C23C 16/45551 |
| | | | | 118/730 |
| 2012/0267341 | A1* | 10/2012 | Kato | H01L 21/02164 |
| | | | | 216/37 |
| 2013/0071567 | A1* | 3/2013 | Hsiao | C23C 16/45576 |
| | | | | 427/255.28 |
| 2013/0098477 | A1* | 4/2013 | Yudovsky | C23C 16/45565 |
| | | | | 137/507 |
| 2013/0130187 | A1* | 5/2013 | Moroi | H01L 21/68771 |
| | | | | 432/32 |
| 2013/0164942 | A1* | 6/2013 | Kato | H01L 21/30 |
| | | | | 438/758 |
| 2013/0189160 | A1* | 7/2013 | Blankenship | G01L 9/0075 |
| | | | | 422/88 |
| 2013/0251904 | A1* | 9/2013 | Kato | C23C 16/402 |
| | | | | 427/255.7 |
| 2013/0306758 | A1* | 11/2013 | Park | C23C 16/345 |
| | | | | 239/418 |
| 2014/0011370 | A1* | 1/2014 | Kato | H01L 21/0206 |
| | | | | 438/782 |
| 2014/0120700 | A1* | 5/2014 | Wang | H01L 21/28556 |
| | | | | 438/477 |
| 2014/0154414 | A1* | 6/2014 | Chuang | H01L 21/0228 |
| | | | | 427/248.1 |
| 2014/0179121 | A1* | 6/2014 | Ikegawa | H01L 21/02148 |
| | | | | 438/782 |
| 2014/0179122 | A1* | 6/2014 | Tachibana | H01L 21/02148 |
| | | | | 438/782 |
| 2014/0193977 | A1* | 7/2014 | Kawamata | H01L 21/3065 |
| | | | | 438/710 |
| 2014/0349032 | A1 | 11/2014 | Kato et al. | |
| 2015/0007774 | A1* | 1/2015 | Iwasaki | C23C 16/45542 |
| | | | | 118/723 R |
| 2015/0013594 | A1* | 1/2015 | Yamada | C30B 25/165 |
| | | | | 117/102 |
| 2015/0140786 | A1* | 5/2015 | Kwak | H01L 31/18 |
| | | | | 438/478 |
| 2015/0194298 | A1* | 7/2015 | Lei | H01L 21/02194 |
| | | | | 438/680 |
| 2015/0211124 | A1* | 7/2015 | Nozawa | H01J 37/32192 |
| | | | | 118/723 MW |
| 2015/0232988 | A1* | 8/2015 | Yamaguchi | C23C 16/4585 |
| | | | | 118/697 |
| 2015/0275360 | A1* | 10/2015 | Hasebe | C23C 16/4412 |
| | | | | 118/730 |

(56) References Cited

U.S. PATENT DOCUMENTS

| | | | |
|---|---|---|---|
| 2015/0275364 A1* | 10/2015 | Thompson | C23C 16/45544 427/532 |
| 2015/0279659 A1* | 10/2015 | Takahashi | H01L 21/68792 438/478 |
| 2015/0329964 A1* | 11/2015 | Hane | C23C 16/45578 118/730 |
| 2016/0010209 A1* | 1/2016 | Hattori | C23C 16/4412 118/723 E |
| 2016/0064246 A1* | 3/2016 | Miura | H01L 21/0206 438/782 |
| 2016/0071722 A1* | 3/2016 | Miura | C23C 16/45551 438/694 |
| 2016/0122873 A1* | 5/2016 | Iwasaki | H01J 37/32449 118/719 |
| 2016/0138162 A1* | 5/2016 | Iwasaki | C23C 16/511 156/345.29 |
| 2016/0172183 A1* | 6/2016 | Kamada | H01L 21/0217 438/792 |
| 2016/0189950 A1* | 6/2016 | Oyama | C23C 16/45551 438/763 |
| 2016/0288018 A1* | 10/2016 | Kikumoto | B01D 19/0005 |
| 2016/0322218 A1* | 11/2016 | Fukiage | H01L 21/02274 |
| 2017/0253971 A1* | 9/2017 | Kawamorita | C23C 16/45551 |
| 2017/0335453 A1* | 11/2017 | Miura | C23C 16/505 |
| 2017/0338099 A1* | 11/2017 | Miura | H01L 21/02211 |
| 2017/0342561 A1* | 11/2017 | Lin | C23C 16/509 |
| 2018/0051374 A1* | 2/2018 | Kato | C23C 16/345 |
| 2018/0142356 A1* | 5/2018 | Krishnan | H01L 21/6719 |
| 2019/0136377 A1* | 5/2019 | Honma | C23C 16/45542 118/723 R |
| 2020/0083075 A1* | 3/2020 | Kwon | C30B 25/02 |
| 2020/0149168 A1* | 5/2020 | Honma | H01J 37/32449 118/719 |

FOREIGN PATENT DOCUMENTS

| | | | | |
|---|---|---|---|---|
| JP | 2015-226996 | | 12/2015 | |
| JP | 2015226996 A | * | 12/2015 | C23C 16/455 |
| JP | 2016092026 A | * | 5/2016 | C23C 16/4584 |
| JP | 2017155313 A | * | 9/2017 | C23C 16/4584 |
| WO | WO-2013122043 A1 | * | 8/2013 | H01J 37/3244 |

\* cited by examiner

D1
LARGE
SMALL
41-5 41-4 41-3 41-2 41-1

D1
HIGH
LOW
41-5 41-4 41-3 41-2 41-1

D1
LARGE
SMALL
41-5 41-4 41-3 41-2 41-1

D1
HIGH
LOW
41-5 41-4 41-3 41-2 41-1

D1
LARGE
SMALL
41-5 41-4 41-3 41-2 41-1

D1
HIGH
LOW
41-5 41-4 41-3 41-2 41-1

FILM DEPOSITION APPARATUS

CROSS-REFERENCE TO RELATED APPLICATION

The present application is based upon and claims the benefit of priority of Japanese Patent Application No. 2016-102231, filed on May 23, 2016, the entire contents of which are incorporated herein by reference.

BACKGROUND OF THE INVENTION

1. Field of the Invention

An aspect of this disclosure relates to a film deposition apparatus.

2. Description of the Related Art

In a known film deposition method, hydroxyl groups are formed on an inner surface of a recess formed in a substrate, an organic aminosilane gas is supplied and caused to be adsorbed to the substrate on which the hydroxyl groups are formed, and an oxidizing gas is supplied to the substrate to which the organic aminosilane gas is adsorbed to form a silicon oxide film on the inner surface of the recess (see, for example, Japanese Laid-Open Patent Publication No. 2013-135154).

In this film deposition method, the substrate on which hydroxyl groups are formed is exposed to oxygen plasma to cause a part of the hydroxyl groups to be desorbed and thereby control the distribution of the hydroxyl groups. For example, this method makes it possible to perform a film deposition process with high bottom-up capability and to form a film that is conformal to the shape of the recess.

With the above film deposition method, however, hydroxyl groups desorbed as a result of the exposure to the oxygen plasm may spread along with the flow of a gas and adhere again to the surface of the silicon oxide film. If hydroxyl groups adhere again to the surface of the silicon oxide film, the distribution of hydroxyl groups on the surface of the substrate becomes uneven, and the in-plane uniformity of a film formed on the substrate decreases.

SUMMARY OF THE INVENTION

In an aspect of this disclosure, there is provided a film deposition apparatus including a process chamber, a rotary table that is disposed in the process chamber and includes an upper surface for holding a substrate, a first reaction gas supply part that is disposed in a first process region above the rotary table and configured to supply a first reaction gas to the upper surface of the rotary table, a second reaction gas supply part that is disposed in a second process region apart from the first reaction gas supply part in a circumferential direction of the rotary table and configured to supply a second reaction gas, which reacts with the second reaction gas, to the upper surface of the rotary table, and separation gas supply parts that are disposed in a separation region between the first reaction gas supply part and the second reaction gas supply part in the circumferential direction of the rotary table and configured to supply a separation gas for separating the first reaction gas and the second reaction gas, the separation gas supply parts being arranged at predetermined intervals along a radial direction of the rotary table. The separation gas supply parts are configured to supply, in addition to the separation gas, an additive gas for controlling adsorption of the first reaction gas or for etching a part of material components included in the first reaction gas.

DESCRIPTION OF THE PREFERRED EMBODIMENTS

Embodiments of the present invention are described below with reference to the accompanying drawings. Throughout the specification and the drawings, the same reference number is assigned to substantially the same components, and repeated descriptions of those components are omitted.

<Film Deposition Apparatus>

Figure 1:
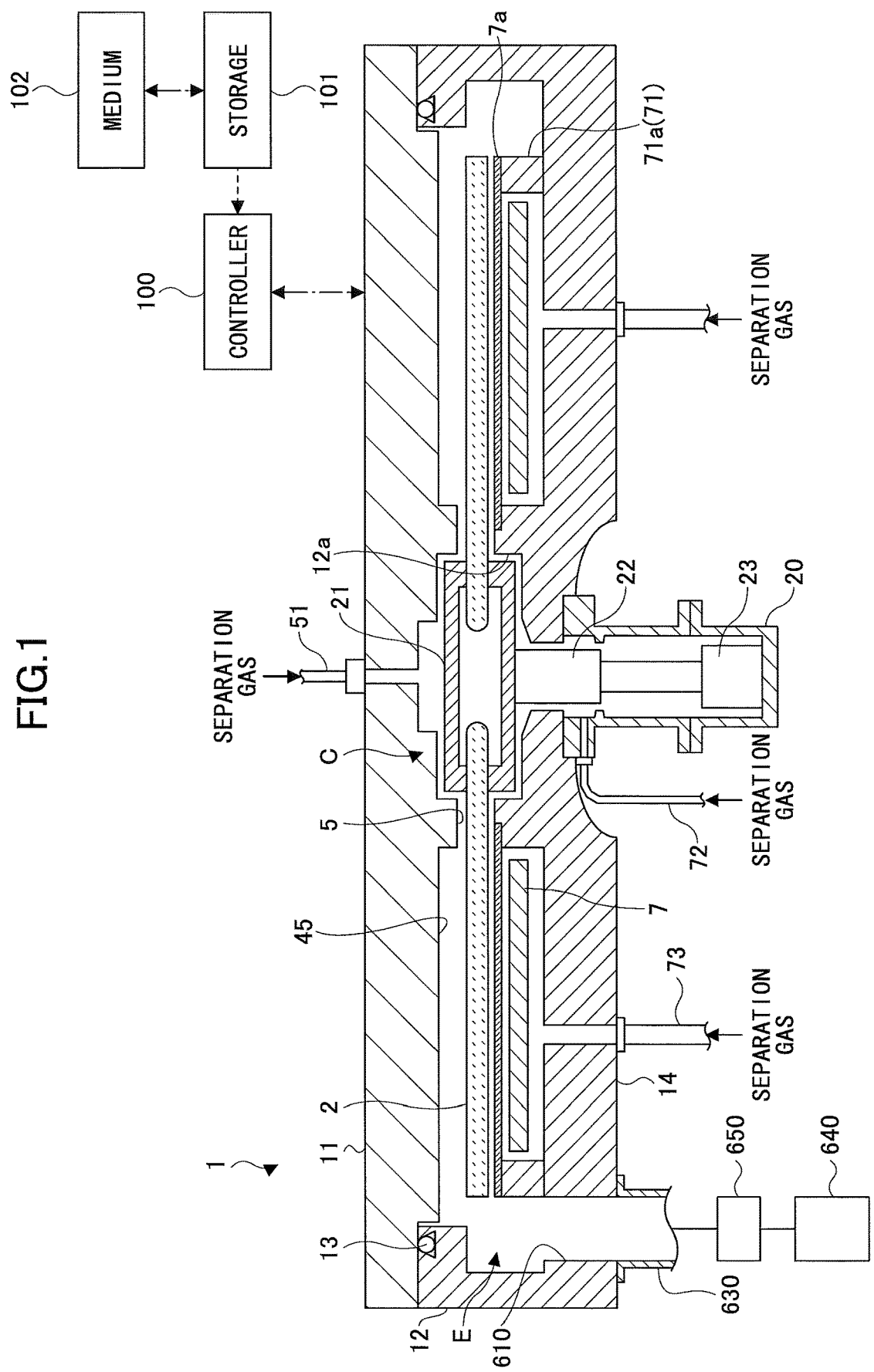
FIG. 1 is a cross-sectional view of a film deposition apparatus according to an embodiment.
Figure 2:
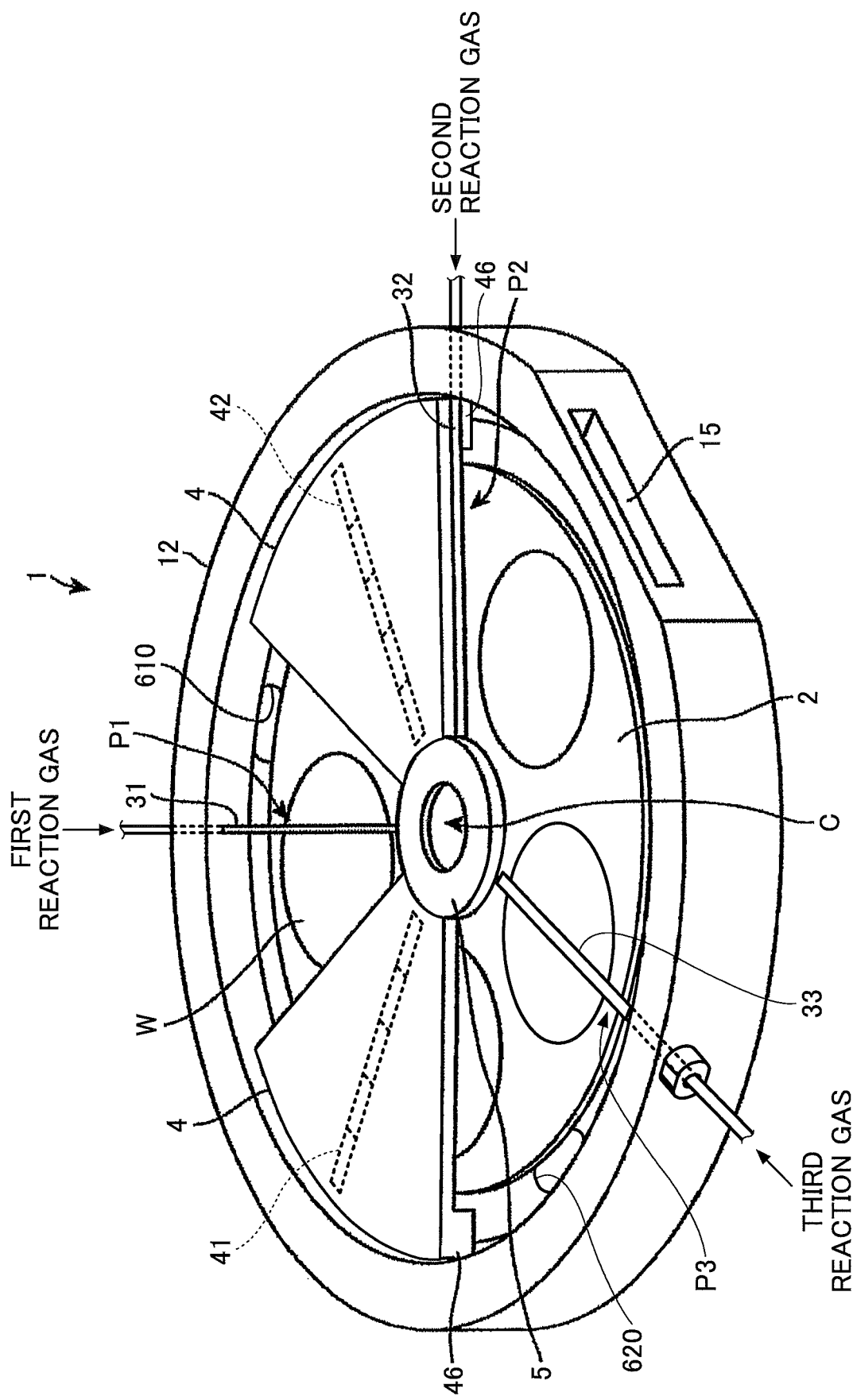
FIG. 2 is a perspective view of an internal configuration of a vacuum chamber of the film deposition apparatus of FIG. 1.
Figure 3:
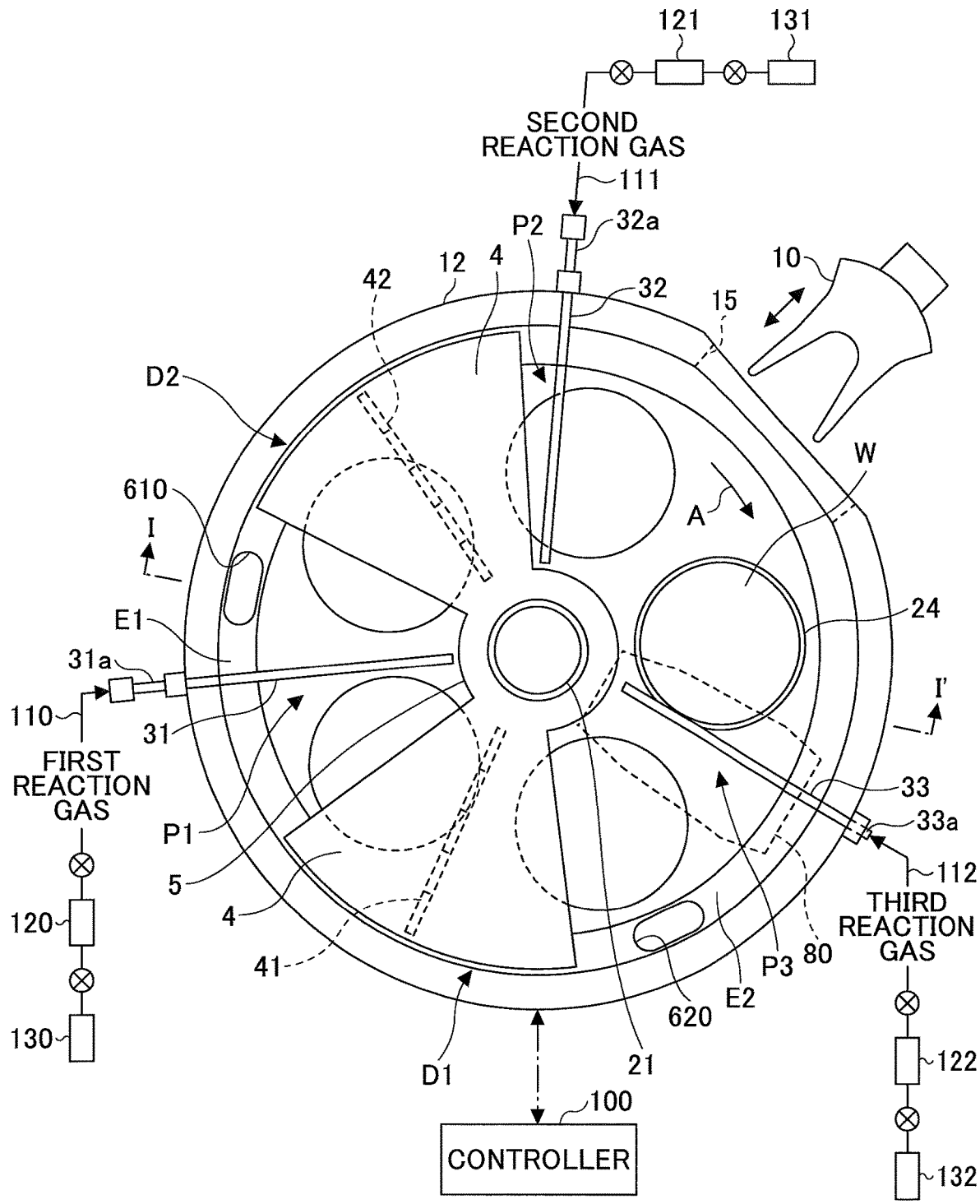
FIG. 3 is a plan view of the internal configuration of the vacuum chamber of the film deposition apparatus of FIG. 1.

A film deposition apparatus according to an embodiment is described below. FIG. 1 is a cross-sectional view of the film deposition apparatus according to the present embodiment. FIG. 2 is a perspective view of an internal configuration of a vacuum chamber of the film deposition apparatus of FIG. 1. FIG. 3 is a plan view of the internal configuration of the vacuum chamber of the film deposition apparatus of FIG. 1.

As illustrated by FIGS. 1 through 3, the film deposition apparatus may include a vacuum chamber 1 having a substantially circular planar shape, and a rotary table 2 that is disposed in the vacuum chamber 1 such that the center of the vacuum chamber 1 matches the center of rotation of the rotary table 2. The vacuum chamber 1 is a process chamber where a film is formed on a wafer. The vacuum chamber 1 may include a chamber body 12 shaped like a closed-end cylinder and a top plate 11 that is hermetically and detachably attached via a sealing part 13 (FIG. 1) such as an O-ring to the upper surface of the chamber body 12.

A central portion of the rotary table 2 is fixed to a cylindrical core 21, and the core 21 is fixed to an upper end of a rotational shaft 22 that extends in the vertical direction. The rotational shaft 22 passes through a bottom 14 of the vacuum chamber 1, and a lower end of the rotational shaft 22 is attached to a drive unit 23 that rotates the rotational shaft 22 about a vertical axis. The rotational shaft 22 and the drive unit 23 are housed in a tubular case 20 with an opening at the upper end. A flange formed at the upper end of the case 20 is hermetically attached to a lower surface of the bottom 14 of the vacuum chamber 1 so that the internal atmosphere of the case 20 is isolated from the external atmosphere.

As illustrated in FIGS. 2 and 3, multiple (five in this example) recesses 24 for holding substrates or semiconductor wafers (which are hereafter referred to as "wafers W") are formed in an upper surface of the rotary table 2. The recesses 24 have a substantially circular shape and are arranged along the rotational direction (or the circumferential direction) of the rotary table 2. In FIG. 3, for brevity, the wafer W is illustrated only in one of the recesses 24. Each recess 24 has an inside diameter that is slightly (e.g., 4 mm) greater than the diameter of the wafer W, and has a depth that is substantially the same as the thickness of the wafer W. Accordingly, when the wafer W is placed in the recess 24, the height of the upper surface of the wafer W becomes substantially the same as the height of the upper surface (in an area where no recess 24 is formed) of the rotary table 2. Through holes (not shown) are formed in the bottom of each recess 24. For example, three elevating pins pass through the through holes to support the lower surface of the wafer W and move the wafer W up and down.

FIGS. 2 and 3 illustrate the internal configuration of the vacuum chamber 1. For illustration purposes, the top plate 11 is omitted in FIGS. 2 and 3. As illustrated by FIGS. 2 and 3, a reaction gas nozzle 31, a reaction gas nozzle 32, a reaction gas nozzle 33, and separation gas supply parts 41 and 42 are arranged at intervals along the circumferential direction of the vacuum chamber 1 (a direction indicated by an arrow A in FIG. 3). In this example, the reaction gas nozzle 33, the separation gas supply parts 41, the reaction gas nozzle 31, the separation gas supply parts 42, and the reaction gas nozzle 32 are arranged clockwise (along the rotational direction of the rotary table 2) in this order from a transfer opening 15. The reaction gas nozzle 31, the reaction gas nozzle 32, and the reaction gas nozzle 33 may be formed of, for example, quartz. The separation gas supply parts 41 and 42 are formed in protruding parts 4 described later.

The reaction gas nozzles 31, 32, and 33 are inserted through an outer wall of the chamber body 12 into the vacuum chamber 1 such that the reaction gas nozzles 31, 32, and 33 extend in the radial direction of the chamber body 12 in parallel with the upper surface of the rotary table 2. Gas introduction ports 31a, 32a, and 33a at the ends of the reaction gas nozzles 31, 32, and 33 are fixed to the outer wall of the chamber body 12.

In the present embodiment, as illustrated in FIG. 3, the reaction gas nozzle 31 is connected via a pipe 110 and a flow rate controller 120 to a first reaction gas supply source 130. The reaction gas nozzle 32 is connected via a pipe 111 and a flow rate controller 121 to a second reaction gas supply source 131. The reaction gas nozzle 33 is connected via a pipe 112 and a flow rate controller 122 to a third reaction gas supply source 132. Five separation gas supply parts 41 are arranged in the radial direction of the rotary table 2, and five separation gas supply parts 42 are arranged in the radial direction of the rotary table 2. Details of the separation gas supply parts 41 and 42 are described later. The number of each of the separation gas supply parts 41 and the separation gas supply parts 42 may also be less than or equal to four or greater than or equal to six. However, the number of each of the separation gas supply parts 41 and the separation gas supply parts 42 is preferably greater than or equal to three, and is more preferably greater than or equal to five to easily control the in-plane uniformity of the thickness of a film formed on the wafer W. Also in FIG. 3, the separation gas supply parts 41 are placed in the same position in the rotational direction of the rotational table 2, and the separation gas supply parts 42 are placed in the same position in the rotational direction of the rotational table 2. However, the separation gas supply parts 41 may be placed in different positions in the rotational direction of the rotational table 2, and the separation gas supply parts 42 may be placed in different positions in the rotational direction of the rotational table 2.

In each of the reaction gas nozzles 31, 32, and 33, multiple gas discharge holes 35 are formed. The gas discharge holes 35 have openings facing the rotary table 2, and are arranged at an interval of, for example, 10 mm along the longitudinal direction of each of the reaction gas nozzles 31, 32, and 33. With the gas discharge holes 35, the reaction gas nozzles 31, 32, and 33 can supply a first reaction gas, a second reaction gas, and a third reaction gas, respectively, to the upper surface of the rotary table 2.

A region below the reaction gas nozzle 31 is a first process region P1 where the first reaction gas is adsorbed onto the wafer W. A region below the reaction gas nozzle 32 is a second process region P2 where the second reaction gas, which reacts with the first reaction gas adsorbed onto the wafer W in the first process region P1, is supplied to form a molecular layer of a reaction product. The molecular layer of the reaction product constitutes a film to be formed. A region below the reaction gas nozzle 33 is a third process region P3 where the third reaction gas is supplied to the reaction product (film) formed in the second process region P2 to modify the reaction product.

As necessary, a plasma generator 80 may be provided above the third process region P3. In FIG. 3, the plasma generator 80 is simplified and indicated by a dotted line. Details of the plasma generator 80 are described later.

The first reaction gas may be any type of gas used as a material gas of a film to be formed. For example, when a silicon oxide film ($SiO_2$ film) is to be formed, a silicon-containing gas such as organic aminosilane is selected as the first reaction gas. As another example, when a metal oxide film is to be formed, a reaction gas containing a metallic element of the metal oxide film is selected as the first reaction gas. When a titanium oxide film ($TiO_2$ film) is to be formed as a metal oxide film, a Ti-containing gas such as $TiCl_4$ is selected as the first reaction gas.

The second reaction gas may be any type of reaction gas that can react with the first reaction gas to form a reaction product. For example, when an oxide film such as an $SiO_2$ film or a metal oxide film is to be formed, an oxidizing gas is selected as the second reaction gas. As another example, when a nitride film such as a silicon nitride film (SiN film) or a metal nitride film is to be formed, a nitriding gas is selected as the second reaction gas. As more specific examples, when an $SiO_2$ film is to be formed, an $O_3$ gas may be selected; when a $TiO_2$ film is to be formed, an $H_2O$ or $H_2O_2$ gas may be selected; and when an SiN film or a TiN film is to be formed, an $NH_3$ gas may be selected.

The third reaction gas may be any type of modifying gas that can rearrange elements in a reaction product formed as a result of reaction between the first reaction gas and the second reaction gas, and thereby increase the density of a film made of the reaction product. For example, when an $SiO_2$ film is to be formed, an Ar gas or a mixed gas of an Ar gas and an $O_2$ gas is selected as the third reaction gas.

As illustrated in FIGS. 2 and 3, two protruding parts 4 are provided in the vacuum chamber 1. The protruding parts 4 form separation regions D1 and D2 together with the separation gas supply parts 41 and 42. The protruding parts 4 are attached to the lower surface of the top plate 11 to protrude toward the rotary table 2. Each protruding part 4 has a fan-like planar shape whose apex is cut off to form an arc. The protruding part 4 is disposed such that its inner arc is connected to a protrusion 5 (described later), and its outer arc extends along the inner circumferential surface of the chamber body 12 of the vacuum chamber 1.

Figure 4:
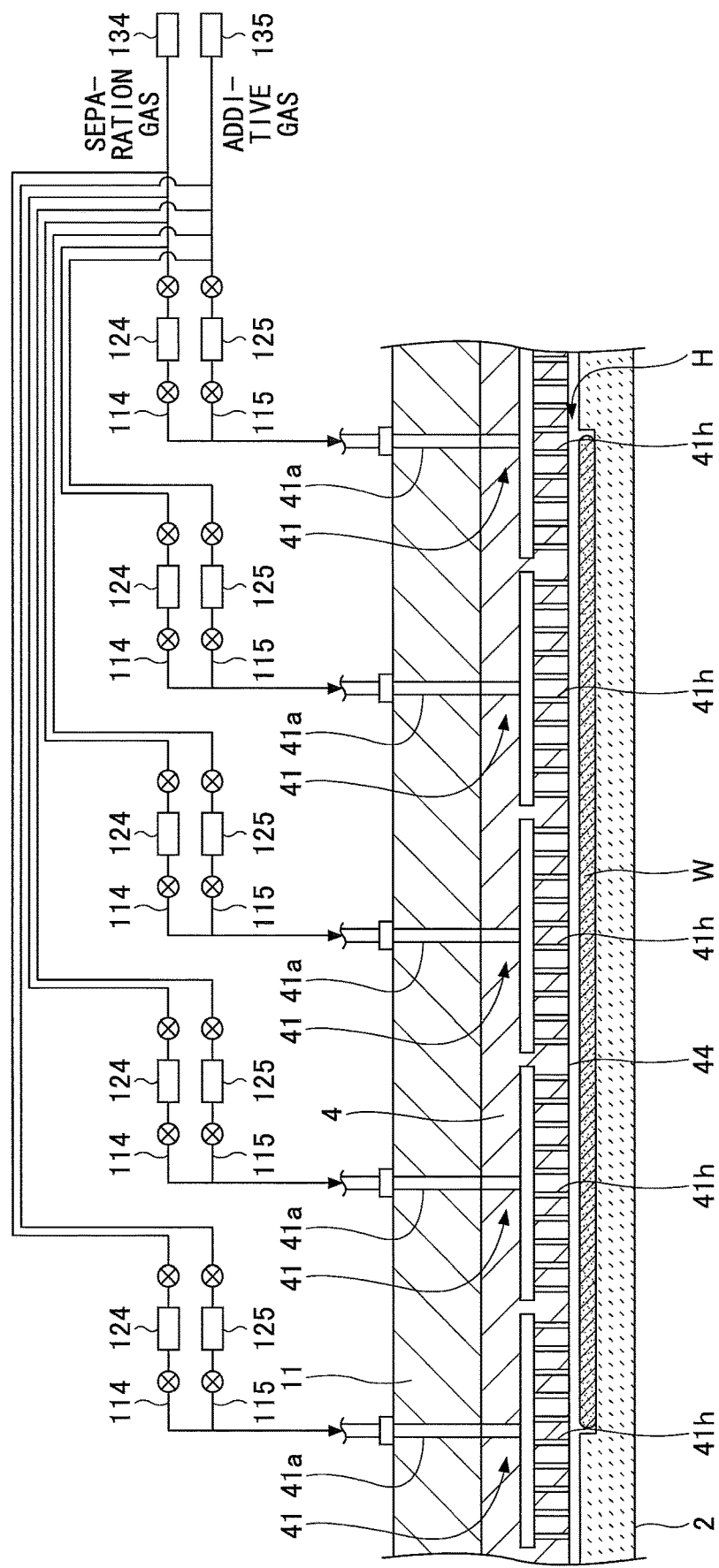
FIG. 4 is a cross-sectional view of a separation region of the film deposition apparatus of FIG. 1.

FIG. 4 is a cross-sectional view of the separation region D1 of the film deposition apparatus of FIG. 1 taken along the radial direction of the rotary table 2.

As illustrated in FIG. 4, in one of the protruding parts 4, the separation gas supply parts 41 are arranged at predetermined intervals along the radial direction of the rotary table 2. Each separation gas supply part 41 includes multiple gas discharge holes 41h and a gas introduction port 41a communicating with the gas discharge holes 41h. The gas discharge holes 41h are arranged in the longitudinal direction of the separation gas supply part 41 (or the radial direction of the rotary table 2). The gas introduction port 41a is connected via a pipe 114 and a flow rate controller 124 to a separation gas supply source 134, and is also connected via a pipe 115 and a flow rate controller 125 to an additive gas supply source 135.

The separation gas supply source 134 and the additive gas supply source 135 supply a separation gas and an additive gas, respectively. The separation gas and the additive gas flow through the pipes 114 and 115, and the flow rates of the separation gas and the additive gas are controlled by the flow rate controllers 124 and 125, respectively. Then, the flow-rate-controlled separation gas and additive gas are supplied via the gas introduction port 41a and the gas discharge holes 41h into the vacuum chamber 1. The supply flow rate of the separation gas and the supply flow rate of the additive gas in the radial direction of the rotary table 2 can be adjusted by separately controlling multiple flow rate controllers 124 and multiple flow rate controllers 125.

The additive gas may be any type of reaction gas that can control the adsorption of the first reaction gas, or any type of etching gas that can etch a part of material components included in the first reaction gas. The reaction gas that can control the adsorption of the first reaction gas may either increase or decrease the adsorption of the first reaction gas.

For example, when an $SiO_2$ film is to be formed, a hydrogen-containing gas is selected as the reaction gas to increase the adsorption of the first reaction gas. A hydrogen-containing gas forms OH groups on the surface of $SiO_2$ that is a reaction product formed by the reaction between an Si-containing gas and an oxidizing gas, and increases the adsorption of the Si-containing gas. As the hydrogen-containing gas, for example, an $H_2$ gas may be used. Other types of hydrogen-containing gases may also be used depending on purposes.

As another example, when a $TiO_2$ film is to be formed, a halogen-containing gas such as a fluorine-containing gas or a chlorine-containing gas is selected as the reaction gas to decrease the adsorption of the first reaction gas. A halogen-containing gas forms adsorption inhibitors on the surface of the wafer W to inhibit the adsorption of the first reaction gas to the wafer W. For example, $ClF_3$, $F_2$, $NF_3$, or $CF_4$ may be used as the fluorine-containing gas. Also, for example, $BCl_3$ or $HCl$ may be used as the chlorine-containing gas. Other types of halogen-containing gases may also be used depending on purposes.

Also, when an $SiO_2$ film is to be formed, a chlorine gas may be selected as the etching gas that can etch a part of material components included in the first reaction gas.

As the separation gas, an inert gas such as Ar or He may be used.

In the example of FIG. 4, the separation gas supply parts 41 arranged along the radial direction of the rotary table 2 are connected to the same separation gas supply source 134 and the same additive gas supply source 135. However, the configuration of the separation gas supply parts 41 is not limited to this example. As a variation, the separation gas supply parts 41 may be connected to different separation gas supply sources 134 and different additive gas supply sources 135. In this case, multiple separation gas supply sources 134 and multiple additive gas supply sources 135 corresponding to the separation gas supply parts 41 may be provided.

The separation gas supply parts 42 formed in another one of the protruding parts 4 may have configurations similar to the configurations of the separation gas supply parts 41. That is, each separation gas supply part 42 may include multiple gas discharge holes 42h and a gas introduction port 42a communicating with the gas discharge holes 42h. The gas introduction port 42a may be connected via a pipe 114 and a flow rate controller 124 to the separation gas supply source 134, and also connected via a pipe 115 and a flow rate controller 125 to the additive gas supply source 135.

In the present embodiment, a mixed gas including a separation gas and an additive gas capable of controlling the adsorption of the first reaction gas is supplied from at least one of the separation gas supply parts 41 provided in the separation region D1. Also, only the separation gas is supplied from the remaining separation gas supply parts 41. The mixed gas including the separation gas and the additive gas capable of controlling the adsorption of the first reaction gas is supplied after a reaction product is formed on the wafer W and before the first reaction gas is adsorbed onto the wafer W (or the reaction product). This makes it possible to control the adsorption of the first reaction gas.

Also in the present embodiment, a mixed gas including a separation gas and an additive gas capable of etching a part of material components included in the first reaction gas is supplied from at least one of the separation gas supply parts 42 provided in the separation region D2. Also, only the separation gas may be supplied from the remaining separation gas supply parts 42. The mixed gas including the separation gas and the additive gas capable of etching a part of material components included in the first reaction gas may be supplied after the first reaction gas is adsorbed onto the wafer W and before the first reaction gas is caused to react with the second reaction gas. This makes it possible to control the in-plane distribution of the first reaction gas adsorbed onto the wafer W, and to control the in-plane uniformity of the thickness of a film of a reaction product formed on the wafer W.

Figure 5:
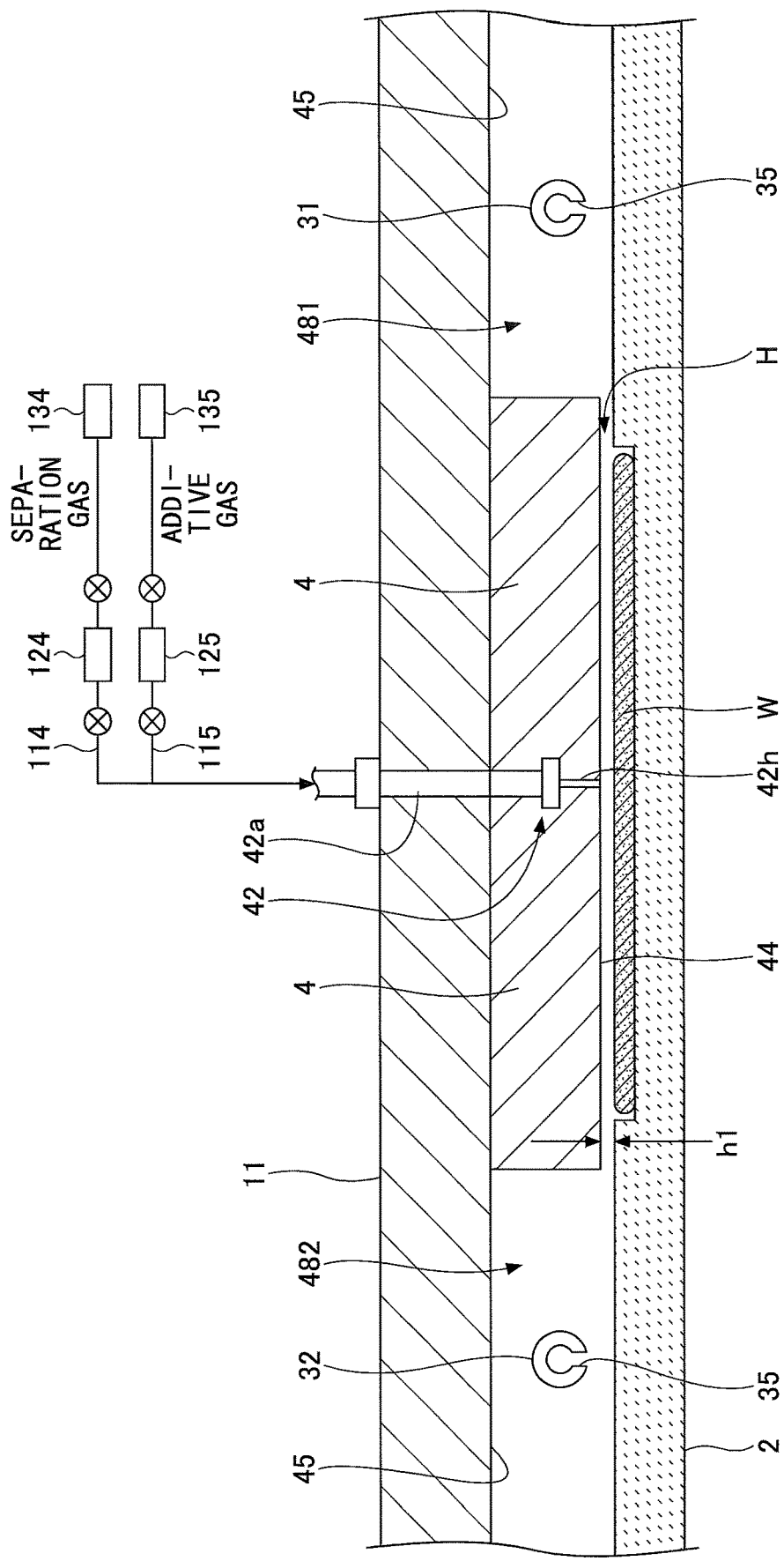
FIG. 5 is a cross-sectional view of the vacuum chamber taken along a concentric circle of a rotary table of the film deposition apparatus of FIG. 1.

FIG. 5 is a cross-sectional view of a part of the vacuum chamber 1 from the reaction gas nozzle 31 to the reaction gas nozzle 32. The cross-sectional view of FIG. 5 is taken along a concentric circle of the rotary table 2 of the film deposition apparatus of FIG. 1. As illustrated in FIG. 5, each protruding part 4 is attached to the lower surface of the top plate 11. In the vacuum chamber 1, flat and lower ceiling surfaces (first ceiling surfaces 44) are formed by the lower surfaces of the protruding parts 4, and higher ceiling surfaces (second ceiling surfaces 45) are formed by the lower surface of the top plate 11. The second ceiling surfaces 45 are located on the sides of the first ceiling surfaces 44 in the circumferential direction, and are at higher positions than the first ceiling surfaces 44. Each of the first ceiling surfaces 44 has a fan-like planar shape whose apex is cut off to form an arc. The gas discharge holes 42h are formed in the middle of the protruding part 4 in the circumferential direction, and are connected to the gas introduction port(s) 42a. The reaction gas nozzles 31 and 32 are provided in spaces below the second ceiling surfaces 45. The reaction gas nozzles 31 and 32 are positioned apart from the second ceiling surfaces 45 and close to the wafer W or the upper surface of the rotary table 2. As illustrated in FIG. 5, the reaction gas nozzle 31 is provided in a space 481 below the second ceiling surface 45 and on the right side of the protruding part 4, and the reaction gas nozzle 32 is provided in a space 482 below the second ceiling surface 45 and on the left side of the protruding part 4.

A narrow separation space H is formed between each of the first ceiling surfaces 44 and the upper surface of the rotary table 2. When a separation gas and/or an additive gas is supplied from the gas discharge holes 42h of the separation gas supply parts 42, the separation gas and/or the additive gas flows through the separation space H toward the spaces 481 and 482. In other words, the separation gas and/or the additive gas flows along the rotational direction of the rotary table 2. Because the volume of the separation space H is less than the volumes of the spaces 481 and 482, the pressure in the separation space H can be kept higher than the pressures in the spaces 481 and 482 by supplying the separation gas and/or the additive gas. Thus, the separation space H with a high pressure is formed between the spaces 481 and 482. Also, the flow of the separation gas and/or the additive gas from the separation space H into the spaces 481 and 482 functions as a counter flow to the first reaction gas from the first process region P1 and the second reaction gas from the second process region P2. Accordingly, the separation space H separates the first reaction gas from the first process region P1 and the second reaction gas from the second process region P2. This configuration prevents the first reaction gas from mixing and reacting with the second reaction gas in the vacuum chamber 1.

A height h1 of the first ceiling surface 44 from the upper surface of the rotary table 2 is preferably determined taking into account, for example, the pressure in the vacuum chamber 1 during a film forming process, the rotational speed of the rotary table 2, and/or the supply flow rate of the separation gas and/or the additive gas so that the pressure in the separation space H becomes higher than the pressures in the spaces 481 and 482.

A protrusion 5 (FIGS. 2 and 3) is formed on the lower surface of the top plate 11 to surround the core 21 to which the rotary table 2 is fixed. The protrusion 5 is in connection with the center-side ends of the protruding parts 4. The lower surface of the protrusion 5 is at the same height as the first ceiling surfaces 44.

Figure 6:
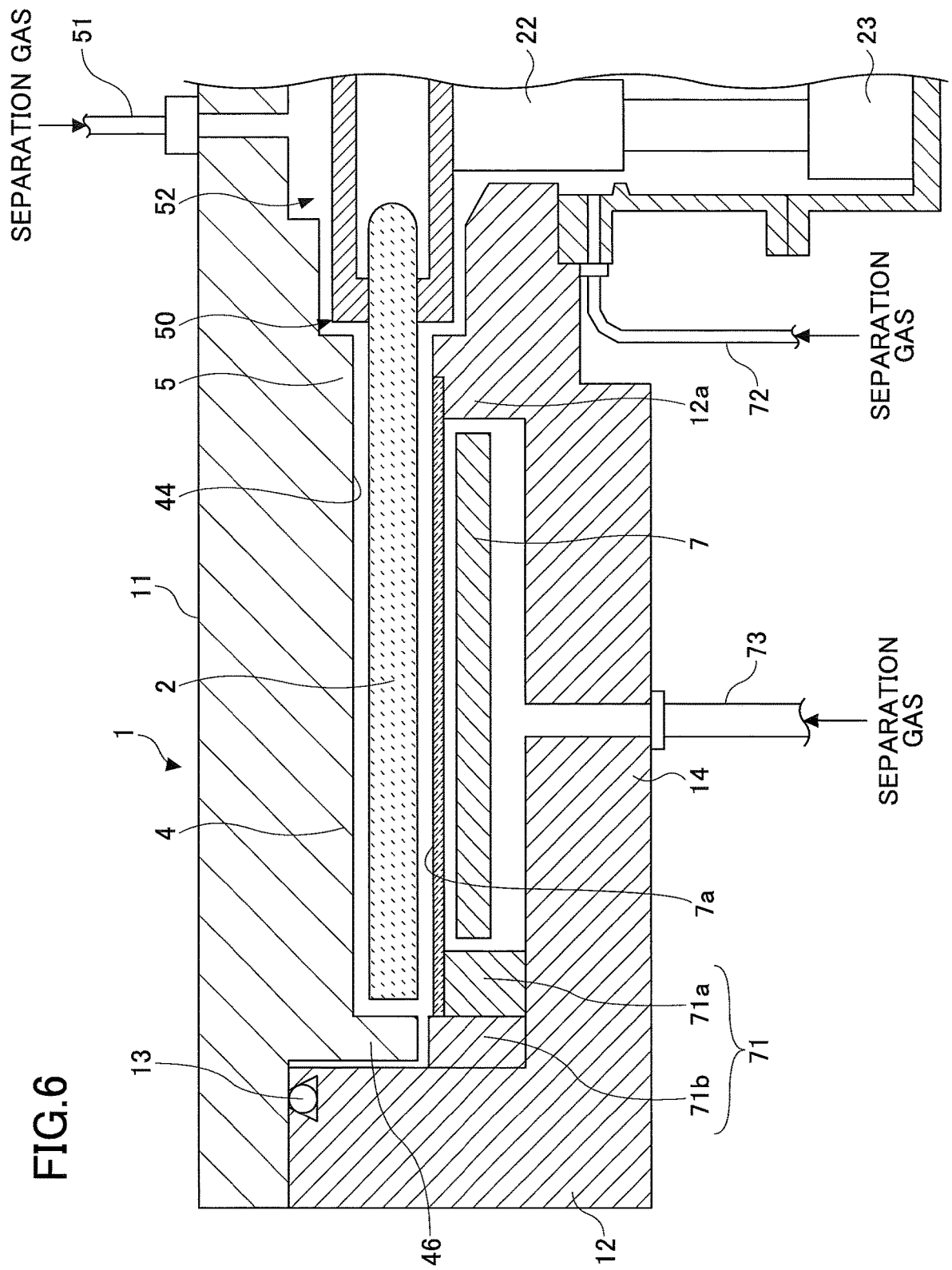
FIG. 6 is another cross-sectional view of the film deposition apparatus of FIG. 1.

FIG. 1 is a cross-sectional view of the film deposition apparatus taken along line I-I' of FIG. 3 and illustrates a section including the second ceiling surfaces 45. FIG. 6 is a cross-sectional view of another section of the film deposition apparatus including the first ceiling surface 44.

As illustrated in FIG. 6, an L-shaped bent part 46 is formed at the periphery of each of the protruding parts 4 (i.e., an end that is closer to the outer wall of the vacuum chamber 1). The bent part 46 faces the outer end face of the rotary table 2. Similarly to the protruding parts 4, the bent parts 46 prevent reaction gases from entering the separation regions D1 and D2 and thereby prevent the reaction gases from being mixed with each other. The protruding parts 4 are provided on the top plate 11, and the top plate 11 is detachable from the chamber body 12. Therefore, a small gap is provided between the outer surface of each of the bent parts 46 and the chamber body 12. For example, the gap between the inner surface of the bent part 46 and the outer end face of the rotary table 2 and the gap between the outer surface of the bent part 46 and the chamber body 12 may be set at a value that is substantially the same as the height of the first ceiling surface 44 from the upper surface of the rotational table 2.

In each of the separation regions D1 and D2, as illustrated in FIG. 6, the inner wall of the chamber body 12 is a vertical surface that is close to the outer surface of the bent part 46. In contrast, in regions other than the separation regions D1 and D2, a portion of the inner wall of the chamber body 12, which extends from a position facing the outer end face of the rotary table 2 to the bottom 14, is recessed outward as illustrated in FIG. 1. The cross section of the recessed portion has a substantially rectangular shape. In the descriptions below, the recessed portion is referred to as an evacuation region. More specifically, an evacuation region communicating with the first process region P1 is referred to as a first evacuation region E1, and an evacuation region communicating with the second process region P2 and the third process region P3 are referred to as a second evacuation region E2. As illustrated in FIGS. 1 through 3, a first evacuation port 610 is formed in the bottom of the first evacuation region E1, and a second evacuation port 620 is formed in the bottom of the second evacuation region E2. As illustrated in FIG. 1, each of the first evacuation port 610 and the second evacuation port 620 is connected via an evacuation pipe 630 to a vacuum pump 640 that is a vacuum evacuator. Also, a pressure controller 650 is provided between the vacuum pump 640 and the evacuation pipe 630.

As illustrated in FIGS. 2 and 3, no separation region is provided between the second process region P2 and the third process region P3. However, a housing for partitioning a space above the rotary table 2 is provided in an area in FIG. 3 where the plasma generator 80 is located. The housing defines an area where the plasma generator 80 is disposed. However, even when the plasma generator 80 is not provided, the housing is preferably provided to separate the second process region P2 and the third process region P3. This is described in more detail later.

As illustrated in FIGS. 1 and 6, a heater unit 7 is provided in a space between the rotary table 2 and the bottom 14 of the vacuum chamber 1. The heater unit 7 heats, via the rotary table 2, the wafer W on the rotary table 2 to a temperature defined by a process recipe. A ring-shaped cover 71 (FIG. 6) is provided below and near the outer edge of the rotary table 2. The cover 71 separates an atmosphere in a space including a region above the rotary table 2 and the first and second evacuation regions E1 and E2 from an atmosphere in a space where the heater unit 7 is provided, and prevents gases from entering a region below the rotary table 2. The cover 71 includes an inner part 71a and an outer part 71b. The inner part 71a is provided below the rotary table 2 and faces the outer edge of the rotary table 2 and a space surrounding the outer edge of the rotary table 2. The outer part 71b is provided between the inner part 71a and the inner wall of the vacuum chamber 1. The outer part 71b is disposed below the bent part 46 formed at the outer end of the protruding part 4 in each of the separation regions D1 and D2. The upper end of the outer part 71b is positioned close to the lower end of the bent part 46. The inner part 71a is disposed below the outer edge of the rotary table 2 (and below a gap surrounding the outer edge of the rotary table 2) and surrounds the entire circumference of the heater unit 7.

A portion of the bottom 14, which is closer to the rotation center than the space housing the heater unit 7, protrudes upward toward the core 21 and the central portion of the lower surface of the rotary table 2, and forms a protrusion 12a. A narrow space is formed between the protrusion 12a and the core 21. Also, a narrow space is formed between the rotational shaft 22 and the inner surface of a through hole formed in the bottom 14 for the rotational shaft 22. These narrow spaces communicate with the case 20.

A purge gas supply pipe 72 is connected to the case 20. The purge gas supply pipe 72 supplies an Ar gas as a purge gas to purge the narrow spaces. Also, purge gas supply pipes 73 are connected to the bottom 14 of the vacuum chamber 1 at positions below the heater unit 7 (only one purge gas supply pipe 73 is illustrated in FIG. 6). The purge gas supply pipes 73 are arranged in the circumferential direction at predetermined angular intervals and used to purge the space housing the heater unit 7.

A lid 7a is provided between the heater unit 7 and the rotary table 2 to prevent entry of gases into the space housing the heater unit 7. The lid 7a covers an area along the circumferential direction and between the inner wall of the outer part 71b (or the upper surface of the inner part 71a) and the upper end of the protrusion 12a. The lid 7a may be formed of, for example, quartz.

A separation gas supply pipe 51 is connected to a central portion of the top plate 11 of the vacuum chamber 1, and supplies an Ar gas as a separation gas into a space 52 between the top plate 11 and the core 21. The separation gas supplied into the space 52 flows through a narrow space 50 between the protrusion 5 and the rotary table 2, and flows toward the periphery of the rotary table 2 along the upper surface of the rotary table 2 on which the wafer W is placed. Due to the separation gas, the pressure in the space 50 is kept higher than the pressure in the space 481 and the space 482. Accordingly, the space 50 prevents the first reaction gas supplied into the first process region P1 and the second reaction gas supplied into the second process region P2 from passing through a central region C and mixing with each other. That is, the space 50 (or the central region C) functions in a manner similar to the separation spaces H (or the separation regions D1 and D2).

As illustrated in FIGS. 2 and 3, a transfer port 15 is formed in the side wall of the vacuum chamber 1. The transfer port 15 is used to transfer the wafer W between an external conveying arm 10 and the rotary table 2. The transfer port 15 is opened and closed by a gate valve (not shown).

Elevating pins and an elevating mechanism (not shown) for lifting the wafer W are provided at a transfer position below the rotary table 2. The elevating pins pass through the recess 24 formed in the rotary table 2 and push the lower surface of the wafer W upward. The wafer W is transferred between the recess 24 of the rotary table 2 and the conveying arm 10 when the recess 24 is at the transfer position facing the transfer port 15.

Figure 7:
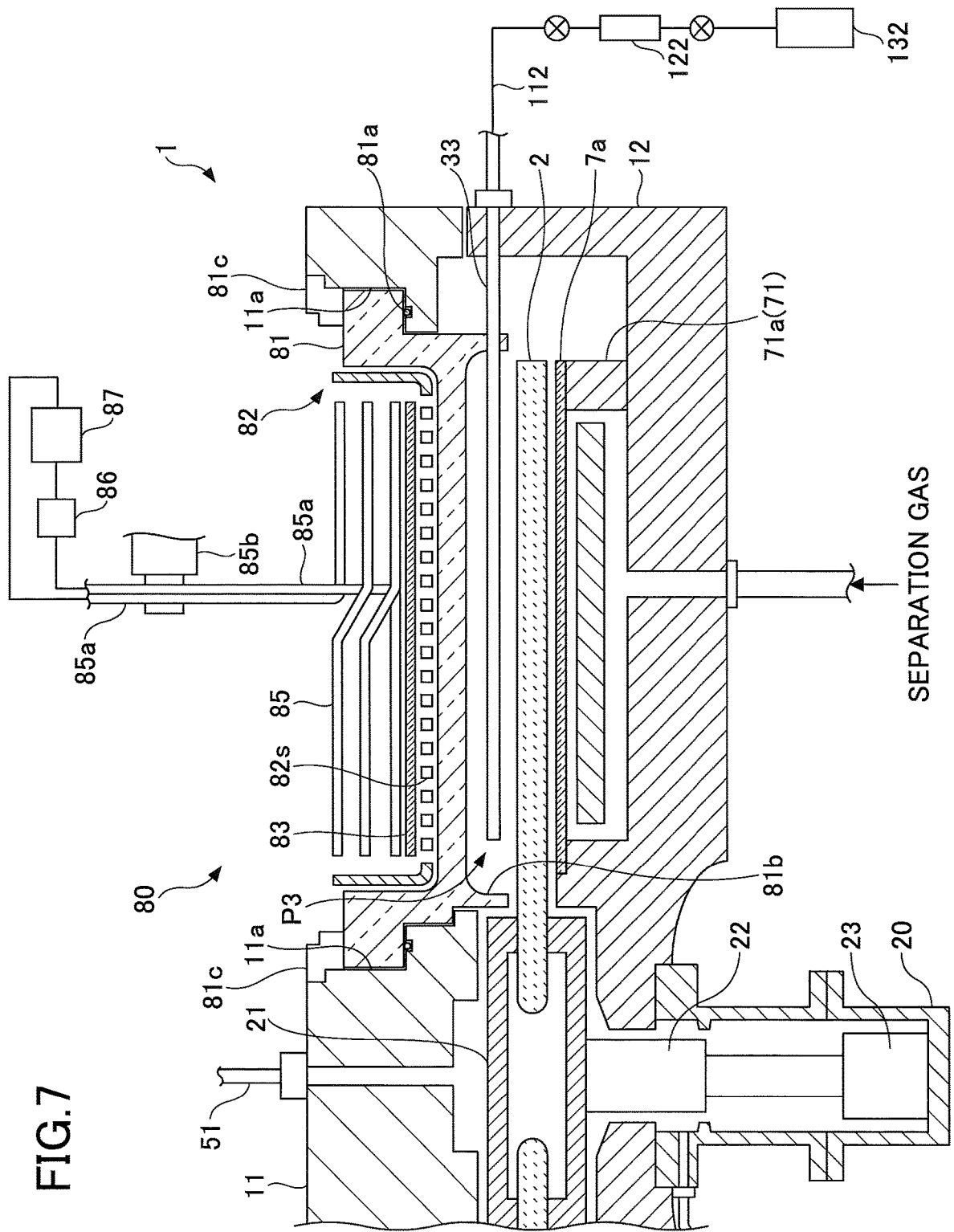
FIG. 7 is a cross-sectional view of a plasma generator of the film deposition apparatus of FIG. 1.
Figure 8:
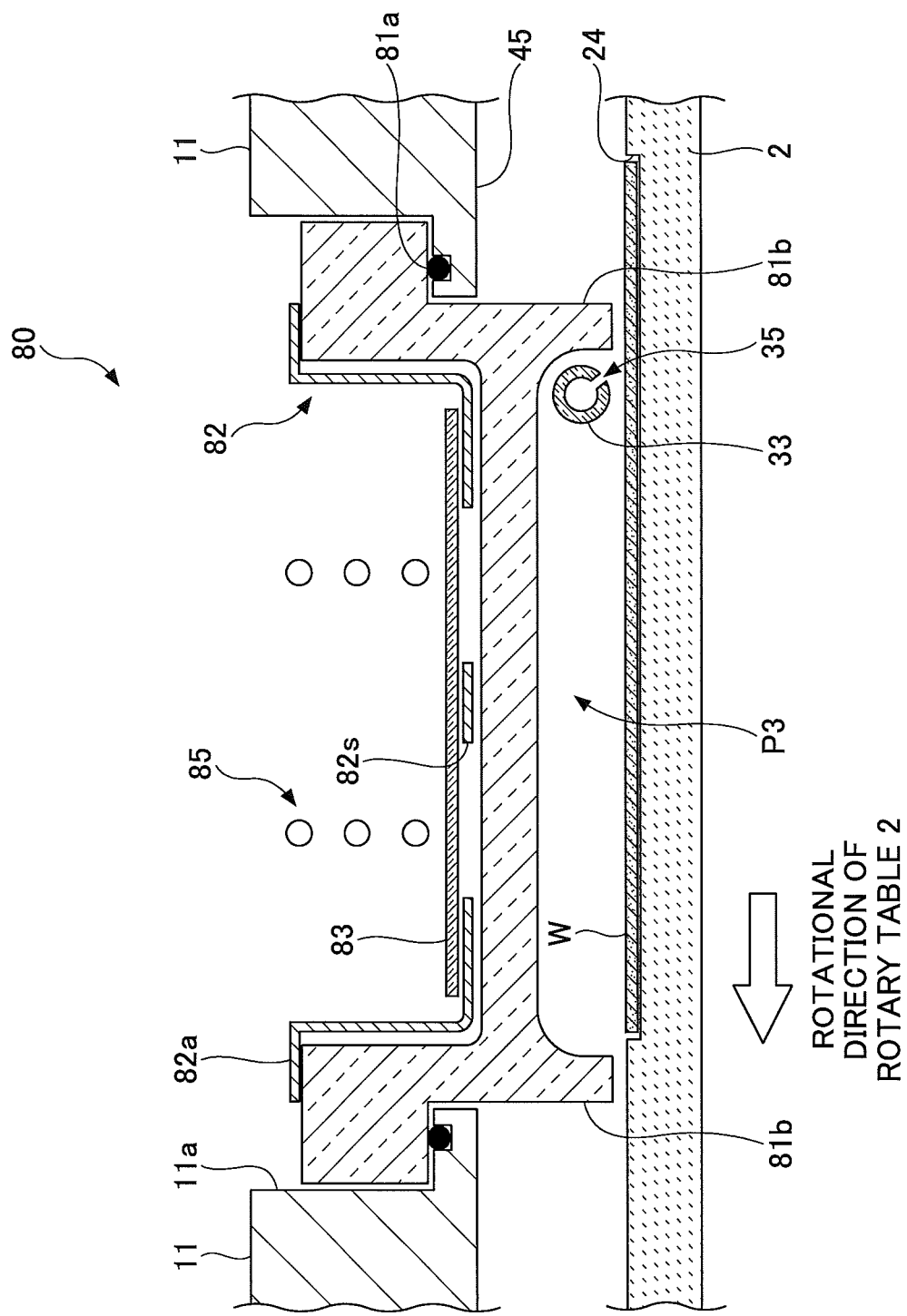
FIG. 8 is another cross-sectional view of the plasma generator of the film deposition apparatus of FIG. 1.
Figure 9:
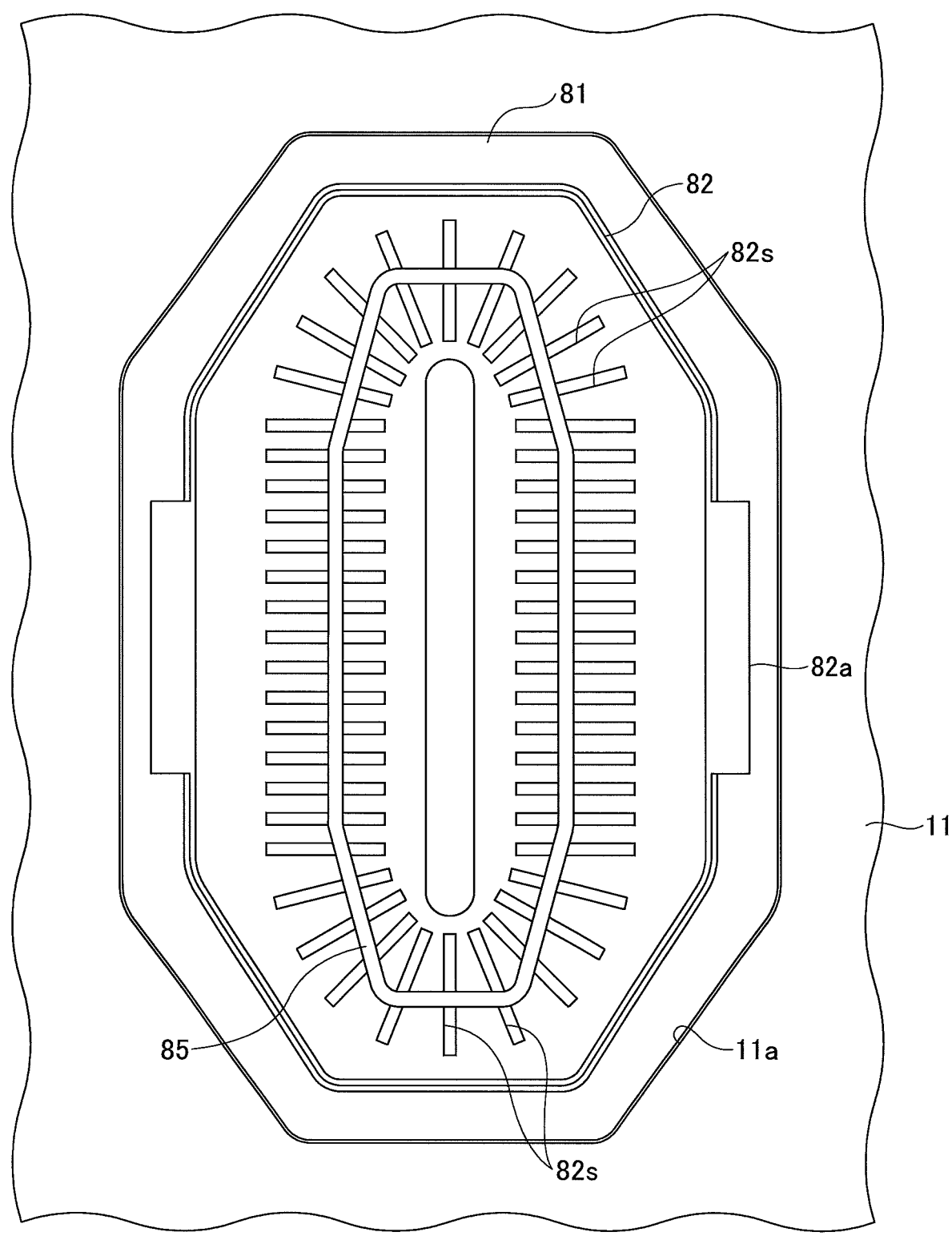
FIG. 9 is a top view of the plasma generator of the film deposition apparatus of FIG. 1.

Next, the plasma generator 80 is described with reference to FIGS. 7 through 9. FIG. 7 is a cross-sectional view of the plasma generator 80 of the film deposition apparatus of FIG. 1 taken along the radial direction of the rotary table 2. FIG. 8 is another cross-sectional view of the plasma generator 80 of the film deposition apparatus of FIG. 1 taken along a direction that is orthogonal to the radial direction of the rotary table 2. FIG. 9 is a top view of the plasma generator 80 of the film deposition apparatus of FIG. 1. In FIGS. 7 through 9, for illustration purposes, some of the components are simplified or omitted.

Referring to FIG. 7, the plasma generator 80 includes a frame 81 formed of a high-frequency transmitting material and having a recess in the upper side, a Faraday shield plate 82, an insulating plate 83, and an antenna 85. The frame 81 is fit into an opening 11a formed in the top plate 11. The Faraday shield plate 82 is placed in the recess of the frame 81, and has a substantially box-shape with an opening on the upper side. The insulating plate 83 is disposed on the bottom surface of the Faraday shield plate 82. The antenna 85 is supported above the insulating plate 83. The antenna 85 is shaped like a coil that has a substantially octagonal shape in plan view.

Multiple steps are formed in the inner surface of the opening 11a of the top plate 11. A groove is formed in one of the steps along the entire circumference, and a sealing part 81a such as an O-ring is fitted into the groove. The frame 81 includes multiple steps corresponding to the steps of the opening 11a. When the frame 81 is fitted into the opening 11a, the lower surface of one of the steps of the frame 81 is brought into contact with the sealing part 81a fitted into the groove formed in one of the steps of the opening 11a. With this configuration, the frame 81 is hermetically attached to the top plate 11. Also, as illustrated in FIG. 7, a pressing part 81c is provided along the periphery of the frame 81 fitted into the opening 11a of the top plate 11 to press the frame 81 downward or toward the top plate 11. The pressing part 81c improves the airtightness between the top plate 11 and the frame 81.

The lower surface of the frame 81 faces the rotary table 2 in the vacuum chamber 1. A protrusion 81b protruding downward (or toward the rotary table 2) is formed along the entire periphery of the lower surface of the frame 81. The lower end of the protrusion 81b is positioned close to the upper surface of the rotary table 2, and a space (which is hereafter referred to as the third process region P3) is defined above the rotary table 2 by the upper surface of the rotary table 2 and the lower surface of the frame 81. The distance between the lower end of the protrusion 81b and the upper surface of the rotary table 2 may be substantially the same as the height h1 of the first ceiling surface 44 from the upper surface of the rotary table 2 in the separation space H (FIG. 5).

The reaction gas nozzle 33 passes through the protrusion 81b and extends in the third process region P3. In the present embodiment, as illustrated in FIG. 7, the reaction gas nozzle 33 is connected via the pipe 112 and the flow rate controller 122 to the third reaction gas supply source 132. The third reaction gas whose flow rate is controlled by the flow rate controller 122 is supplied into the third process region P3.

Multiple gas discharge holes 35 are formed in the reaction gas nozzle 33 at a predetermined interval (e.g., 10 mm) along the longitudinal direction of the reaction gas nozzle 33. The third reaction gas is discharged from the gas discharge holes 35. As illustrated in FIG. 8, the gas discharge holes 35 face a direction that is inclined upstream in the rotational direction of the rotary table 2 with respect to a direction perpendicular to the upper surface of the rotary table 2. Accordingly, the reaction gas nozzle 33 discharges a gas in a direction opposite the rotational direction of the rotary table 2. More specifically, the reaction gas nozzle 33 discharges a gas toward a gap between the lower end of the protrusion 81b and the upper surface of the rotary table 2. This configuration prevents a reaction gas and/or a separation gas from flowing into the third process region P3 from a space below the second ceiling surface 45 located upstream of the plasma generator 80 in the rotational direction of the rotary table 2. Also, as described above, the lower end of the protrusion 81b formed along the periphery of the under surface of the frame 81 is positioned close to the upper surface of the rotary table 2. This configuration makes it possible to easily keep the pressure in the third process region P3 at a high level by supplying a gas from the reaction gas nozzle 33. This configuration also prevents a reaction gas and/or a separation gas from flowing into the third process region P3.

Thus, the frame 81 includes a function to separate the third process region P3 from the second process region P2. Thus, although the entire plasma generator 80 may not necessarily included in the film deposition apparatus of the present embodiment, the film deposition apparatus preferably includes the frame 81 to separate the third process region P3 from the second process region P2 and prevent the entry of the second reaction gas into the third process region P3.

The Faraday shield plate 82 is formed of a conductive material such as a metal, and is grounded (not shown). As illustrated in FIG. 9, slits 82s are formed in the bottom of the Faraday shield plate 82. Each of the slits 82s extends in a direction that is substantially orthogonal to the corresponding side of the antenna 85 having a substantially octagonal shape in plan view.

Also, as illustrated in FIGS. 8 and 9, the Faraday shield plate 82 includes two supports 82a that are bent outward from the upper end of the body of the Faraday shield plate 82. The supports 82a are supported by the upper surface of the frame 81, and the Faraday shield plate 82 is thereby supported in a predetermined position in the frame 81.

The insulating plate 83 is formed of, for example, silica glass, has a size that is slightly smaller than the bottom surface of the Faraday shield plate 82, and is placed on the bottom surface of the Faraday shield plate 82. The insulating plate 83 insulates the Faraday shield plate 82 and the antenna 85 from each other, while transmitting high-frequency waves emitted from the antenna 85 downward.

The antenna 85 is formed by winding a copper hollow pipe, for example, three times into a substantially octagonal shape in plan view. Cooling water can be circulated through the pipe to prevent the antenna 85 from being heated to a high temperature due to high-frequency power supplied to the antenna 85. The antenna 85 includes an upright part 85a to which a support 85b is attached. The antenna 85 is held by the support 85b in a predetermined position in the Faraday shield plate 82. A high-frequency power supply 87 is connected via a matching box 86 to the upright part 85a. The high-frequency power supply 87 can generate high-frequency power with a frequency of, for example, 13.56 MHz.

In the plasma generator 80 configured as described above, when high-frequency power is supplied from the high-frequency power supply 87 via the matching box 86 to the antenna 85, the antenna 85 generates an electromagnetic field. An electric field component of the electromagnetic field is blocked by the Faraday shield plate 82, and is not transmitted to a lower region. Conversely, a magnetic field component of the electromagnetic field is transmitted via the slits 82s of the Faraday shield plate 82 into the third process region P3. The magnetic field component activates the third reaction gas supplied at a predetermined flow rate from the reaction gas nozzle 33 into the third process region P3.

As illustrated in FIG. 1, the film deposition apparatus of the present embodiment also includes a controller 100 implemented by a computer for controlling operations of the entire film deposition apparatus. A memory of the controller 100 stores a program according to which the controller 100 controls the film deposition apparatus to perform a film deposition method described later. The program may include steps for causing the film deposition apparatus to perform the film deposition method. The program may be stored in a medium 102 such as a hard disk, a compact disk, a magneto-optical disk, a memory card, or a flexible disk. The program stored in the medium 102 is read by a reading device into a storage 101, and installed in the controller 100.

The controller 100 may be configured to control the flow rate controllers 124 and 125 for adjusting the flow rates of an additive gas and a separation gas supplied to the separation gas supply parts 41 and 42. This configuration makes it possible to adjust the supply flow rates of the additive gas and the separation gas in the radial direction of the rotary table 2, and thereby makes it possible to control the adsorption of the first reaction gas in the radial direction of the rotary table 2. This in turn makes it possible to control the in-plane uniformity of the thickness of a film formed on the wafer W.

<Film Deposition Method>

Next, an exemplary film deposition method performed by the film deposition apparatus according of the present embodiment is described. In the exemplary film deposition method, it is assumed that an $SiO_2$ film is formed on an inner surface of a trench formed in a silicon wafer.

In the film deposition method, it is also assumed that a material gas including an organic aminosilane gas is supplied from the reaction gas nozzle 31, an oxidizing gas including an $O_2$ gas is supplied from the reaction gas nozzle 32, and a modifying gas including an $O_2$ gas and an Ar gas is supplied from the reaction gas nozzle 33. The modifying gas supplied from the reaction gas nozzle 33 is activated by the plasma generator 80. It is also assumed that five separation gas supply parts 41 are arranged in the radial direction of the rotary table 2. Further, it is assumed that a separation gas including an Ar gas and an additive gas including an $H_2$ gas are supplied from one of the separation gas supply parts 41 that is closest to the center of the rotary table 2, and only the separation gas including the Ar gas is supplied from the other separation gas supply parts 41.

First, the film deposition apparatus (or the controller 100) opens a gate valve (not shown), and causes the conveying arm 10 (FIG. 3) to carry the wafer W via the transfer port 15 into the vacuum chamber 1 and transfer the wafer W to the recess 24 of the rotary table 2. The film deposition apparatus may include elevating pins (not shown) used to transfer the wafer W from the conveying arm 10 to the recess 24. When the recess 24 stops at a position facing the transfer port 15, the elevating pins are caused to move up and down via through holes formed in the bottom of the recess 24 to receive the wafer W. The film deposition apparatus intermittently rotates the rotary table 2 and places the wafer W in each of five recesses 24 of the rotary table 2.

Next, the film deposition apparatus closes the gate valve and evacuates the vacuum chamber 1 using the vacuum pump 640 to the maximum possible degree of vacuum. Next, the film deposition apparatus causes the separation gas supply parts 41 and 42 to discharge an Ar gas as a separation gas at a predetermined flow rate, and causes the separation gas supply pipe 51 and the purge gas supply pipes 72 and 73 to discharge an Ar gas at a predetermined flow rate. Then, the pressure controller 650 (FIG. 1) adjusts the pressure in the vacuum chamber 1 to a predetermined process pressure. Next, the film deposition apparatus heats the wafers W using the heater unit 7 while rotating the rotary table 2 clockwise. The rotational speed of the rotary table 2 may be set at any value depending on purposes. Also, the temperature at which the wafer W is heated by the heater unit 7 may be set at any value depending on purposes.

After the above steps, the film deposition apparatus causes the reaction gas nozzle 31 (FIGS. 2 and 3) to supply a material gas including an organic aminosilane gas (adsorption step), and causes the reaction gas nozzle 32 to supply an oxidizing gas including an $O_2$ gas (reaction step). Also, the film deposition apparatus causes the reaction gas nozzle 33 to supply a modifying gas including an $O_2$ gas and an Ar gas (modification step). Further, the film deposition apparatus causes one of the separation gas supply parts 41, which is closest to the center of the rotary table 2 in the radial direction, to supply an Ar gas to which an $H_2$ gas is added (hydroxyl formation step).

As the rotary table 2 rotates, the wafer W repeatedly passes through the first process region 1, the separation region D2, the second process region P2, the third process region P3, and the separation region D1 in this order (see FIG. 3). Here, because five wafers W are on the rotary table 2, processes on the respective wafers W are actually started in the corresponding regions P1 through P3, D1, and D2. However, for brevity, the descriptions below are based on an assumption that the wafer W first passes through the first process region P1.

When the wafer W passes through the first process region P1, the material gas including the organic aminosilane gas is supplied to the wafer W, and organic aminosilane is adsorbed onto the surface of the wafer W and the inner surface of a trench formed in the wafer W.

Next, the wafer W passes through the separation region D2 where the separation gas including the Ar gas is supplied for purging, and then passes through the second process region P2 where the oxidizing gas including the $O_2$ gas is supplied. The $O_2$ gas in the oxidizing gas reacts with organic aminosilane adsorbed onto the surface of the wafer W and the inner surface of the trench, and a molecular layer of an $SiO_2$ film is formed as a reaction product. At this step, OH groups, to which organic aminosilane is easily adsorbed, are formed on the surface of the molecular layer of the $SiO_2$ film.

Next, the wafer W passes through the third process region P3 where the modifying gas including the activated $O_2$ gas and Ar gas is supplied. The modifying gas including the activated $O_2$ gas and Ar gas easily reaches the surface of the wafer W and an upper part (a part near the opening) of the trench, but hardly reaches an area near the bottom of the trench. Also, the modifying gas including the activated $O_2$ gas and Ar gas causes the OH groups on the surface of the $SiO_2$ film to be desorbed. Accordingly, a part of the OH groups is desorbed from the surface of the molecular layer of the $SiO_2$ film formed on the surface of the wafer W and the upper part of the trench. However, the OH groups are hardly desorbed from the surface of the molecular layer of the $SiO_2$ film formed near the bottom of the trench of the wafer W. Here, the OH groups desorbed from the upstream side of the wafer W (a side of the wafer W closer to the center of the rotary table 2) spread in the downstream direction (toward the outer edge of the rotary table 2 in the radial direction) along with the flow of a process gas flowing toward the second evacuation port 620. As a result, at a downstream position in the direction of flow of the process gas, the OH groups may adhere again to the surface of the molecular layer of the $SiO_2$ film formed on the surface of the wafer W and the inner surface of the trench. In this case, the amount of the OH groups on the downstream side becomes greater than that on the upstream side, and the in-plane distribution of the OH groups on the wafer W becomes uneven. Also, the OH groups spreading in the downstream direction along with the flow of the process gas flowing toward the second evacuation port 620 may also adhere to the surface and the inner surface of a trench of a wafer W adjacent to the wafer W from which the OH groups are desorbed. In this case, the amount of OH groups on different wafers W may become uneven.

Next, the wafer W passes through the separation region D1 where the separation gas including the Ar gas and the additive gas including the $H_2$ gas are supplied. At this step, the separation gas including the Ar gas and the additive gas including the $H_2$ gas are supplied from one of the separation gas supply parts 41 that is closest to the center of the rotary table 2 in the radial direction, and only the separation gas including the Ar gas is supplied from the other four separation gas supply parts 41. As a result, OH groups are selectively (locally) formed on the surface of the wafer W and the inner surface of the trench on the upstream side of the wafer W (a side closer to the center of the rotary table 2). Here, the ratio of the supply flow rate of the $H_2$ gas to the supply flow rate of the Ar gas is determined such that the amount of OH groups formed near the bottom of the trench is maintained greater than the amount of OH groups formed on the upper part of the trench.

Next, the wafer W passes through the first process region P1 where the material gas including the organic aminosilane gas is supplied, and organic aminosilane is adsorbed onto the molecular layer of the $SiO_2$ film on the surface of the wafer W and the inner surface of the trench. The organic aminosilane gas is hardly adsorbed onto an area where no OH group is present, and easily adsorbed onto an area where OH groups are present. Accordingly, a greater amount of organic aminosilane is adsorbed onto an area near the bottom of the trench where a greater amount of OH groups is present. Also, OH groups are substantially uniformly formed on the surface of the wafer W and the upper part of the trench. Therefore, organic aminosilane is substantially uniformly adsorbed onto the surface of the wafer W and the upper part of the trench.

Next, the wafer W passes through the separation region D2 where the separation gas including the Ar gas is supplied for purging, and then passes through the second process region P2 where the oxidizing gas including the $O_2$ gas is supplied. The $O_2$ gas in the oxidizing gas reacts with organic aminosilane adsorbed onto the surface of the wafer W and the inner surface of the trench, and a molecular layer of an $SiO_2$ film is formed as a reaction product. At this step, because a greater amount of organic aminosilane is adsorbed onto an area near the bottom of the trench, a greater amount of $SiO_2$ film is formed near the bottom of the trench. This makes it possible to perform filling film formation with high bottom-up capability. Also, organic aminosilane is substantially uniformly adsorbed onto the surface of the wafer W and the upper part of the trench. Accordingly, an $SiO_2$ film with a substantially uniform thickness can be formed on the wafer W.

Thereafter, the rotary table 2 is repeatedly rotated while supplying reaction gases. As a result, an $SiO_2$ film is deposited from the bottom of the trench without blocking the opening of the trench, and an $SiO_2$ film with high in-plane uniformity is formed on the wafer W. Thus, the above method makes it possible to fill the trench with a seamless film without forming a void, and makes it possible to perform high-quality filling film formation. This in turn makes it possible to achieve high in-plane uniformity and high inter-plane uniformity of films.

As described above, in the film deposition method of the present embodiment, atomic layer deposition (ALD) is performed by supplying an additive gas capable of adjusting the amount of OH groups and controlling the adsorption of a material gas before the material gas is adsorbed onto the wafer W. This method makes it possible to control the in-plane uniformity and the inter-plane uniformity of the thickness of films formed on wafers W.

Also, ALD may be performed by supplying an additive gas capable of etching a part of a material gas and thereby adjusting the in-plane distribution of the material gas adsorbed to the wafer W after the material gas is adsorbed to the wafer W and before the material gas is caused to react with an oxidizing gas. This method also makes it possible to control the in-plane uniformity and the inter-plane uniformity of the thickness of films formed on wafers W.

<Simulation Results>

Next, results of simulations performed to study the effectiveness of the film deposition method and the film deposition apparatus of the present embodiment are described with reference to FIGS. 10A through 13B. FIGS. 10A through 13B are drawings illustrating flow distribution and concentration distribution of an $H_2$ gas in the separation region D1. Each of FIGS. 10A, 11A, 12A, and 13A illustrates flow distribution of the $H_2$ gas, and each of FIGS. 10B, 11B, 12B, and 13B illustrates concentration distribution of the $H_2$ gas.

In each of the simulations, an Ar gas and a small amount of $H_2$ gas are supplied from one of five separation gas supply parts 41-1 through 41-5 arranged along the radial direction of the rotary table 2, only the Ar gas is supplied from the other four separation gas supply parts 41, and the flow distribution and the concentration distribution of the $H_2$ gas are observed.

Figure 10A:
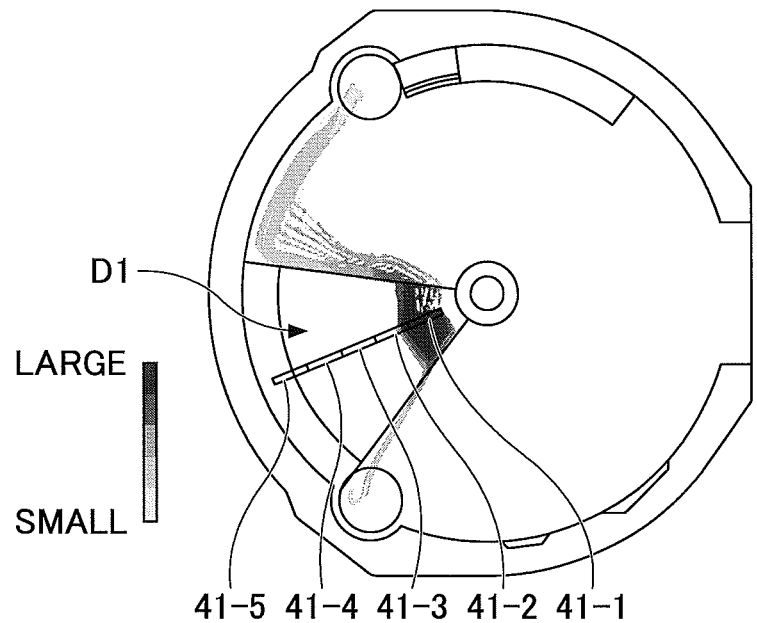
FIGS. 10A and 10B are drawings illustrating flow distribution and concentration distribution of an $H_2$ gas in a separation region.
Figure 10B:
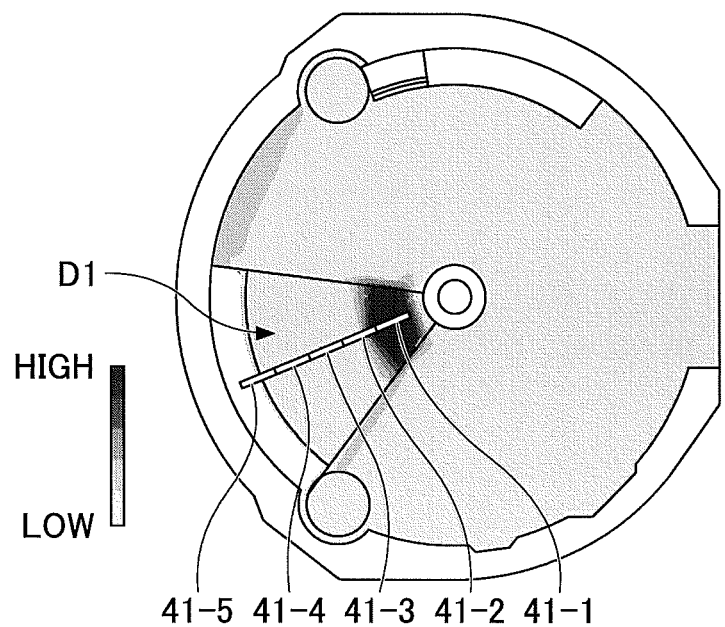

FIGS. 10A and 10B illustrate the flow distribution and the concentration distribution of the $H_2$ gas observed when the Ar gas and the $H_2$ gas are supplied from the separation gas supply part 41-1 that is closest to the center of the rotary table 2, and only the Ar gas is supplied from the other separation gas supply parts 41-2 through 41-5. The flow rates of the $H_2$ gas and the Ar gas supplied from the separation gas supply part 41-1 are 0.2 sccm and 1 slm, respectively; and the flow rate of the Ar gas supplied from each of the separation gas supply parts 41-2 through 41-5 is 1 slm.

As illustrated by FIG. 10A, the $H_2$ gas supplied from the separation gas supply part 41-1 flows in the separation region D1 (separation space H), which is a narrow space, along the rotational direction of the rotary table 2. Also, as illustrated by FIG. 10B, the concentration of the $H_2$ gas supplied from the separation gas supply part 41-1 is high in an area in the radial direction of the rotary table 2 where the separation gas supply part 41-1 is provided. Thus, by supplying the $H_2$ gas and the Ar gas form the separation gas supply part 41-1, it is possible to selectively (or locally) supply the $H_2$ gas to an area in the radial direction of the rotary table 2 where the separation gas supply part 41-1 is provided.

Figure 11A:
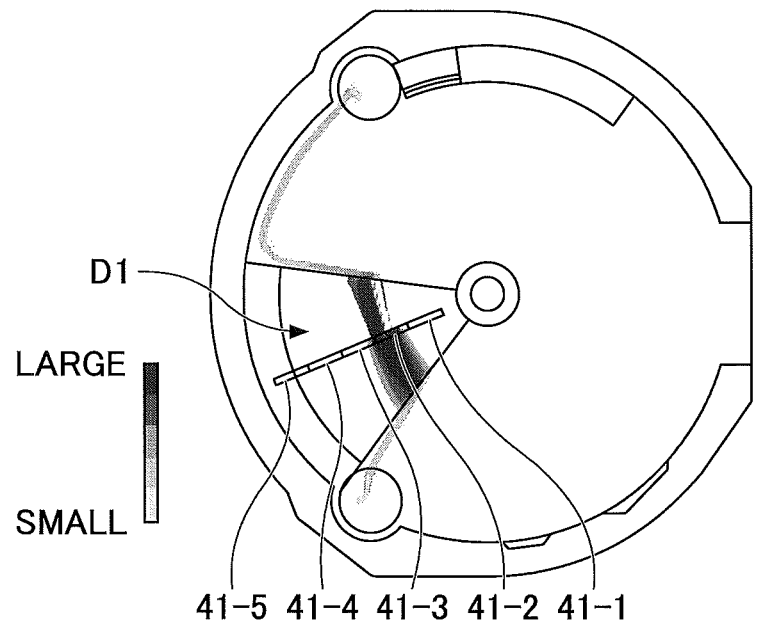
FIGS. 11A and 11B are drawings illustrating flow distribution and concentration distribution of an $H_2$ gas in a separation region.
Figure 11B:
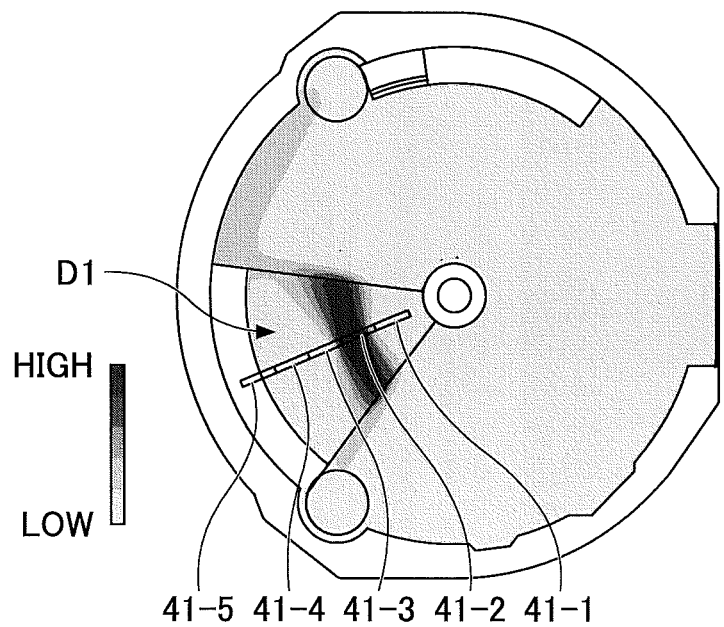

FIGS. 11A and 11B illustrate the flow distribution and the concentration distribution of the $H_2$ gas observed when the Ar gas and the $H_2$ gas are supplied from the separation gas supply part 41-2 that is second closest to the center of the rotary table 2, and only the Ar gas is supplied from the other separation gas supply parts 41-1 and 41-3 through 41-5. The flow rates of the $H_2$ gas and the Ar gas supplied from the separation gas supply part 41-2 are 0.2 sccm and 1 slm, respectively; and the flow rate of the Ar gas supplied from each of the separation gas supply parts 41-1 and 41-3 through 41-5 is 1 slm.

As illustrated by FIG. 11A, the $H_2$ gas supplied from the separation gas supply part 41-2 flows in the separation region D1 (separation space H), which is a narrow space, along the rotational direction of the rotary table 2. Also, as illustrated by FIG. 11B, the concentration of the $H_2$ gas supplied from the separation gas supply part 41-2 is high in an area in the radial direction of the rotary table 2 where the separation gas supply part 41-2 is provided. Thus, by supplying the $H_2$ gas and the Ar gas form the separation gas supply part 41-2, it is possible to selectively (or locally) supply the $H_2$ gas to an area in the radial direction of the rotary table 2 where the separation gas supply part 41-2 is provided.

Figure 12A:
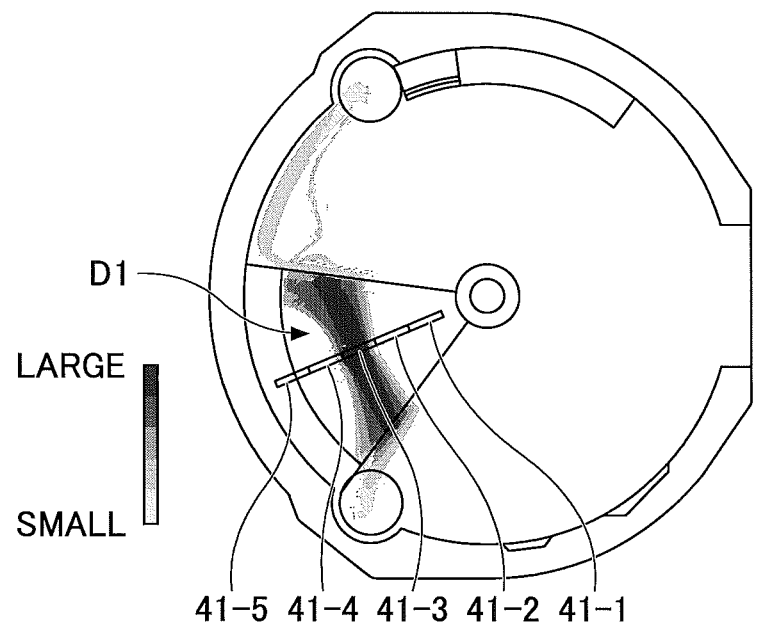
FIGS. 12A and 12B are drawings illustrating flow distribution and concentration distribution of an $H_2$ gas in a separation region.
Figure 12B:
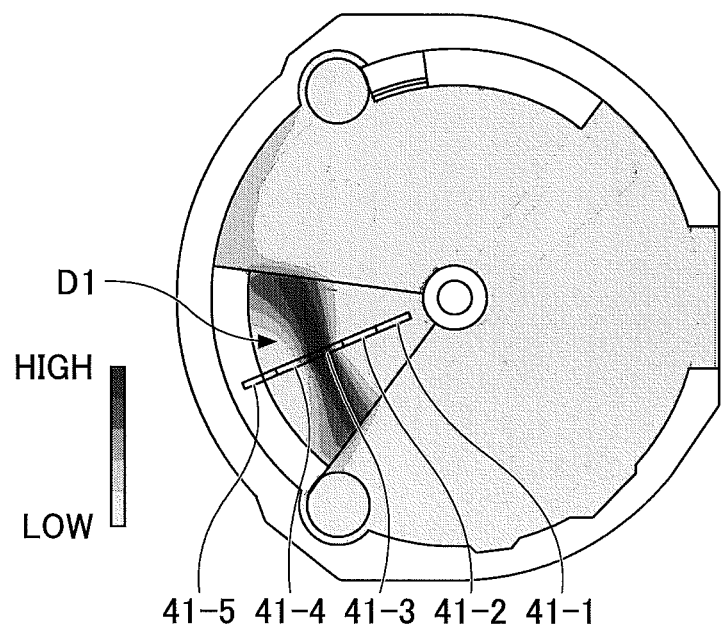

FIGS. 12A and 12B illustrate the flow distribution and the concentration distribution of the $H_2$ gas observed when the Ar gas and the $H_2$ gas are supplied from the separation gas supply part 41-3 that is third closest to the center of the rotary table 3, and only the Ar gas is supplied from the other separation gas supply parts 41-1, 41-2, 41-4, and 41-5. The flow rates of the $H_2$ gas and the Ar gas supplied from the separation gas supply part 41-3 are 0.2 sccm and 1 slm, respectively; the flow rate of the Ar gas supplied from each of the separation gas supply parts 41-1 and 41-2 is 2 slm; and the flow rate of the Ar gas supplied from each of the separation gas supply parts 41-4 and 41-5 is 4 slm.

As illustrated by FIG. 12A, the $H_2$ gas supplied from the separation gas supply part 41-3 flows in the separation region D1 (separation space H), which is a narrow space, along the rotational direction of the rotary table 2. Also, as illustrated by FIG. 12B, the concentration of the $H_2$ gas supplied from the separation gas supply part 41-3 is high in an area in the radial direction of the rotary table 2 where the separation gas supply part 41-3 is provided. Thus, by supplying the $H_2$ gas and the Ar gas form the separation gas supply part 41-3, it is possible to selectively (or locally) supply the $H_2$ gas to an area in the radial direction of the rotary table 2 where the separation gas supply part 41-3 is provided. In the example of FIGS. 12A and 12B, the flow rate of the Ar gas supplied from each of the separation gas supply parts 41-4 and 41-5 is set at a value that is greater than the flow rate of the Ar gas supplied from each of the separation gas supply parts 41-1 and 41-2. With this configuration, the flow of the $H_2$ gas form the separation gas supply part 41-3 toward the outer edge of the rotary table 2 in the radial direction is blocked by the flow of the Ar gas supplied at a high flow rate from the separation gas supply parts 41-4 and 41-5. Accordingly, most of the $H_2$ gas supplied from the separation gas supply part 41-3 flows in the rotational direction of the rotary table 2. Thus, it is possible to more selectively (or locally) supply the $H_2$ gas by adjusting the flow rates of the Ar gas supplied from the separation gas supply parts 41-1, 41-2, 41-4, and 41-5 that supply only the Ar gas.

Figure 13A:
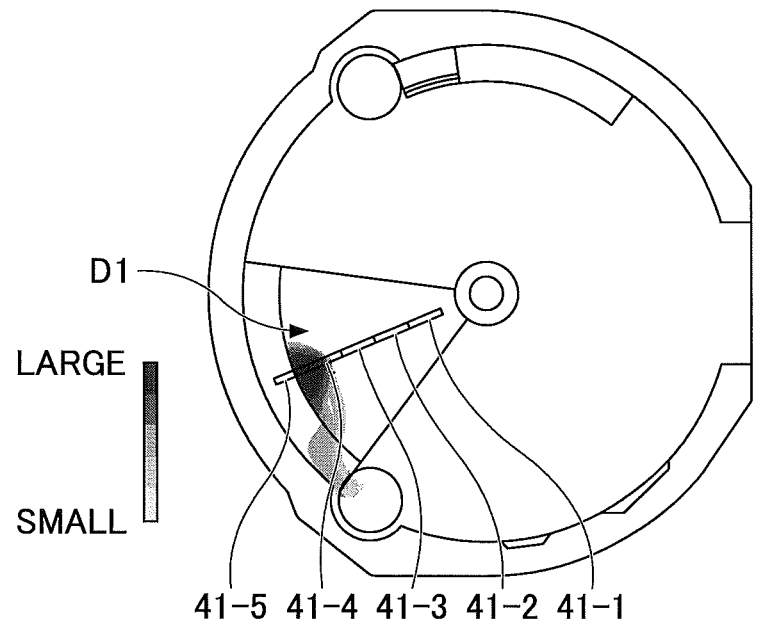
FIGS. 13A and 13B are drawings illustrating flow distribution and concentration distribution of an $H_2$ gas in a separation region.
Figure 13B:
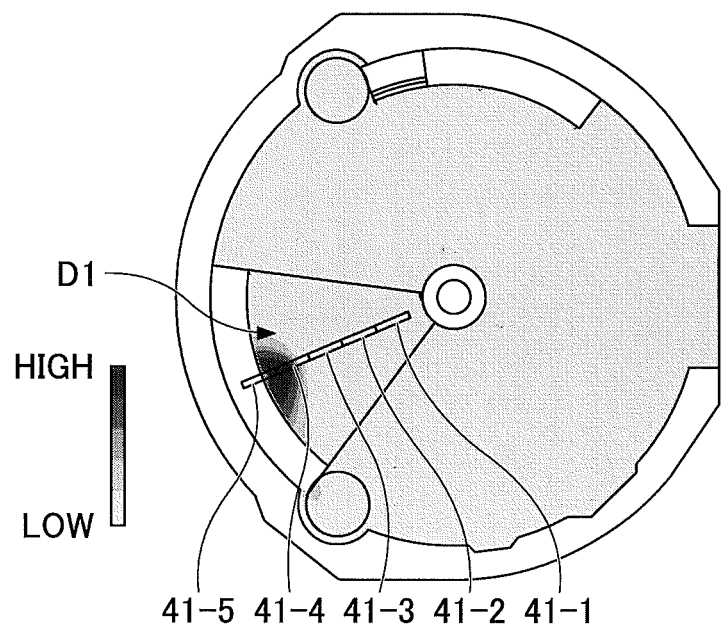

FIGS. 13A and 13B illustrate the flow distribution and the concentration distribution of the $H_2$ gas observed when the Ar gas and the $H_2$ gas are supplied from the separation gas supply part 41-4 that is fourth closest to the center of the rotary table 4, and only the Ar gas is supplied from the other separation gas supply parts 41-1 through 41-3 and 41-5. The flow rates of the $H_2$ gas and the Ar gas supplied from the separation gas supply part 41-4 are 0.2 sccm and 1 slm, respectively; and the flow rate of the Ar gas supplied from each of the separation gas supply parts 41-1 through 41-3 and 41-5 is 1 slm.

As illustrated by FIG. 13A, the $H_2$ gas supplied from the separation gas supply part 41-4 flows in the separation region D1 (separation space H), which is a narrow space, along the rotational direction of the rotary table 2. Also, as illustrated by FIG. 13B, the concentration of the $H_2$ gas supplied from the separation gas supply part 41-4 is high in an area in the radial direction of the rotary table 2 where the separation gas supply part 41-4 is provided. Thus, by supplying the $H_2$ gas and the Ar gas form the separation gas supply part 41-4, it is possible to selectively (or locally) supply the $H_2$ gas to an area in the radial direction of the rotary table 2 where the separation gas supply part 41-4 is provided.

<Results of Experiment>

Figure 14:
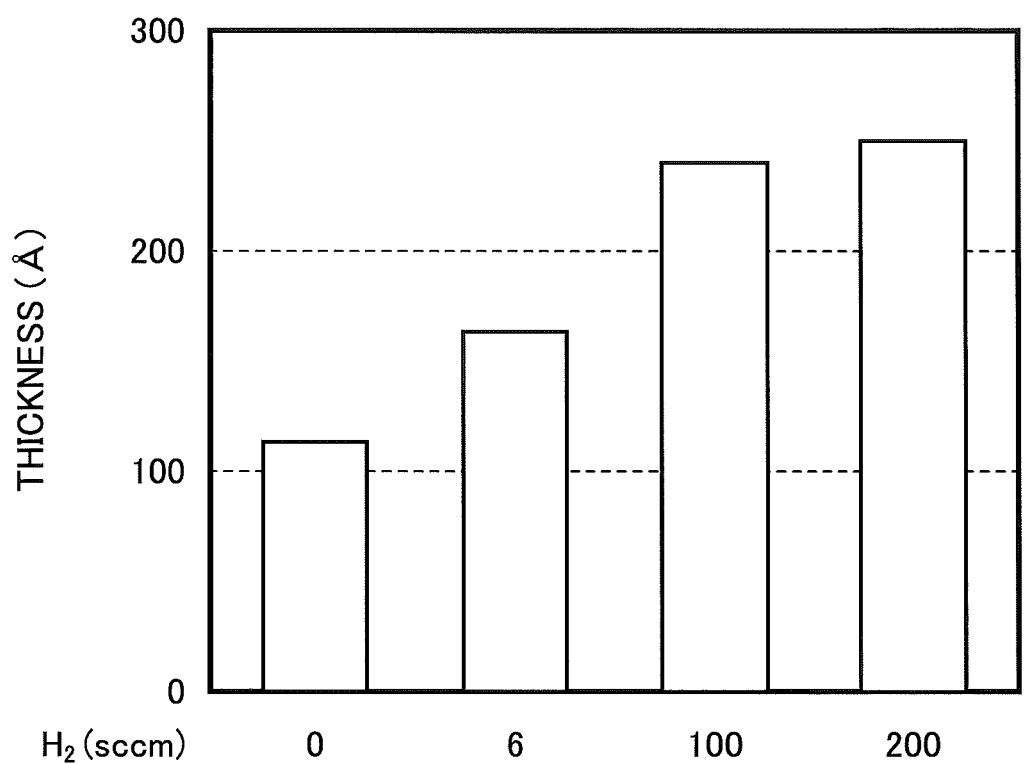
FIG. 14 is a graph illustrating a relationship between the supply flow rate of an $H_2$ gas and the thickness of a silicon oxide film formed on a wafer.

Next, results of an experiment indicating the effectiveness of the film deposition method and the film deposition apparatus of the present embodiment are described. FIG. 14 is a graph illustrating a relationship between the supply flow rate of an $H_2$ gas and the thickness of an $SiO_2$ film formed on a wafer.

This experiment was performed to confirm whether the adsorption of an organic aminosilane gas would be improved (whether the adsorption inhibition property would be reduced) by supplying an $H_2$ gas to a wafer without activating the $H_2$ gas. In the experiment, the $H_2$ gas was supplied at supply flow rates of 0 sccm, 6 sccm, 100 sccm, and 200 sccm, and the thickness of the $SiO_2$ film in each case was measured to determine the relationship between the supply flow rate of the $H_2$ gas and the thickness of the $SiO_2$ film formed on the wafer.

More specifically, an $SiO_2$ film was formed by supplying an organic aminosilane gas, a mixed gas of an activated Ar gas and an activated $O_2$ gas, and a non-activated $H_2$ gas in this order to the surface of the wafer W. Here, the organic aminosilane gas is an example of a first reaction gas, the mixed gas of the Ar gas and the $O_2$ gas is an example of a second reaction gas, and the $H_2$ gas is an example of an additive gas.

As indicated by FIG. 14, the thickness of the $SiO_2$ film formed on the wafer W is increased by supplying the non-activated $H_2$ gas after supplying the mixed gas of the activated Ar gas and the activated $O_2$ gas and before supplying the organic aminosilane gas. Also, the thickness of the $SiO_2$ film increases as the supply flow rate of the $H_2$ gas increases. As the results indicate, the adsorption of the organic aminosilane gas can be improved by supplying the non-activated $H_2$ gas after supplying the mixed gas of the activated Ar gas and the activated $O_2$ gas and before supplying the organic aminosilane gas.

Based on the above characteristics, the film deposition apparatus of the present embodiment controls the thickness of a film formed on the wafer W in the diametral direction of the wafer W by changing the amount of the $H_2$ gas added to the Ar gas depending on positions in the radial direction of the rotary table 2 (or the diametral direction of the wafer W). Thus, the present embodiment can improve the in-plane uniformity of the thickness of a film formed on the wafer W.

In the above embodiment, the reaction gas nozzle 31 is an example of a first reaction gas supply part, the reaction gas nozzle 32 is an example of a second reaction gas supply part, and the reaction gas nozzle 33 is an example of a third reaction gas supply part.

A film deposition apparatus and a film deposition method according to the embodiments of the present invention are described above. However, the present invention is not limited to the specifically disclosed embodiments, and variations and modifications may be made without departing from the scope of the present invention.

For example, although an $SiO_2$ film is formed to fill a trench formed in the wafer W in the above embodiment, an $SiO_2$ film may be formed to fill a via formed in the wafer W. Also, an $SiO_2$ film may be formed on a surface of the wafer W where recesses such as a trench and a via are not formed.

An aspect of this disclosure provides a film deposition apparatus that can control the in-plane uniformity of the thickness of a film formed on a substrate.

What is claimed is:

1. A film deposition apparatus, comprising:
a process chamber;
a rotary table that is disposed in the process chamber and includes an upper surface for holding a substrate;
a first reaction gas supply part that is disposed in a first process region above the rotary table and configured to supply a first reaction gas to the upper surface of the rotary table;
a second reaction gas supply part that is disposed in a second process region apart from the first reaction gas supply part in a circumferential direction of the rotary table and configured to supply a second reaction gas, which reacts with the first reaction gas, to the upper surface of the rotary table;
separation gas supply parts that are disposed in a separation region between the first reaction gas supply part and the second reaction gas supply part in the circumferential direction of the rotary table and configured to supply a separation gas for separating the first reaction gas and the second reaction gas, the separation gas supply parts being arranged at predetermined intervals along a radial direction of the rotary table; and
a controller, wherein
each of the separation gas supply parts is connected to both of a separation gas supply source that supplies the separation gas and an additive gas supply source that supplies an additive gas; and
the controller is configured to select a separation gas supply part from among the separation gas supply parts, cause the same selected separation gas supply part to supply both of the separation gas and the additive gas selectively to a partial area corresponding to a position of the selected separation gas supply part in the radial direction of the rotary table, and cause other separation gas supply parts of the separation gas supply parts other than the selected separation gas supply part to supply only the separation gas at a same time as causing the selected separation gas supply part to supply both of the separation gas and the additive gas to adjust a concentration distribution of the additive gas in the radial direction of the rotary table and thereby control a thickness of a deposited film in the radial direction.

2. The film deposition apparatus as claimed in claim 1, wherein each of the separation gas supply parts includes gas discharge holes that are arranged in the radial direction of the rotary table and supply the separation gas and the additive gas to the upper surface of the rotary table.

3. The film deposition apparatus as claimed in claim 1, wherein the separation gas supply parts are disposed in a same position in a rotational direction of the rotary table.

4. The film deposition apparatus as claimed in claim 1, wherein the separation gas supply parts are disposed in different positions in a rotational direction of the rotary table.

5. The film deposition apparatus as claimed in claim 1, wherein
the first process region is defined by the upper surface of the rotary table and a first ceiling surface of the process chamber;
the second process region is defined by the upper surface of the rotary table and a second ceiling surface of the process chamber;
the separation region is defined by the upper surface of the rotary table and a third ceiling surface of the process chamber; and
a height of the third ceiling surface from the upper surface of the rotary table is less than heights of the first ceiling surface and the second ceiling surface from the upper surface of the rotary table.

6. The film deposition apparatus as claimed in claim 1, further comprising:
flow rate controllers provided for each of the separation gas supply parts and configured to control supply flow rates of the separation gas and the additive gas.

7. The film deposition apparatus as claimed in claim 1, wherein
the first process region, the second process region, and the separation region are arranged in this order in a rotational direction of the rotary table; and
the separation gas supply parts are configured to supply the additive gas for controlling the adsorption of the first reaction gas.

8. The film deposition apparatus as claimed in claim 7, wherein the separation gas supply parts are configured to supply a hydrogen-containing gas as the additive gas.

9. The film deposition apparatus as claimed in claim 7, wherein the separation gas supply parts are configured to supply a halogen-containing gas as the additive gas.

10. The film deposition apparatus as claimed in claim 1, wherein
the first process region, the separation region, and the second process region are arranged in this order in a rotational direction of the rotary table; and
the separation gas supply parts are configured to supply the additive gas for etching a part of the material components included in the first reaction gas.

11. The film deposition apparatus as claimed in claim 10, wherein
the first reaction gas supply part is configured to supply a silicon-containing gas as the first reaction gas; and
the separation gas supply parts are configured to supply a chlorine gas as the additive gas.

12. The film deposition apparatus as claimed in claim 1, wherein
the second reaction gas supply part is configured to supply an oxidizing gas or a nitriding gas as the second reaction gas.

13. The film deposition apparatus as claimed in claim 1, further comprising:
a third reaction gas supply part that is disposed in a third process region apart from the first reaction gas supply part and the second reaction gas supply part in the circumferential direction of the rotary table and configured to supply, to the upper surface of the rotary table, a third reaction gas for modifying a reaction product formed as a result of reaction between the first reaction gas and the second reaction gas.

14. The film deposition apparatus as claimed in claim 13, further comprising:
a plasma generator that is disposed above the third process region and configured to activate the third reaction gas.

15. The film deposition apparatus as claimed in claim 1, wherein the substrate is a wafer having a surface in which a recess is formed.

16. The film deposition apparatus as claimed in claim 15, wherein the recess is a trench or a via formed in the surface of the wafer.

17. The film deposition apparatus as claimed in claim 1, wherein the additive gas is for controlling adsorption of the first reaction gas or for etching a part of material components included in the first reaction gas.

* * * * *